United States Patent
Lavenier et al.

(10) Patent No.: US 9,823,293 B2
(45) Date of Patent: Nov. 21, 2017

(54) METHOD FOR DIAGNOSING AN ELECTRICAL CIRCUIT

(75) Inventors: Francois-Regis Lavenier, Exincourt (FR); Mircea Mateica, Timisoara (RO); Gerd Meyering, Haren (DE); Arnd Langenstein, Essen (DE)

(73) Assignee: INERGY AUTOMOTIVE SYSTEMS RESEARCH (Societe Anonyme), Brussels (BE)

( * ) Notice: Subject to any disclaimer, the term of this patent is extended or adjusted under 35 U.S.C. 154(b) by 1109 days.

(21) Appl. No.: 13/819,087

(22) PCT Filed: Aug. 23, 2011

(86) PCT No.: PCT/EP2011/064493
§ 371 (c)(1),
(2), (4) Date: May 7, 2013

(87) PCT Pub. No.: WO2012/025541
PCT Pub. Date: Mar. 1, 2012

(65) Prior Publication Data
US 2013/0222008 A1    Aug. 29, 2013

(30) Foreign Application Priority Data

Aug. 26, 2010    (EP) .................................... 10174212
Dec. 17, 2010    (EP) .................................... 10195575

(51) Int. Cl.
*G01R 31/34*    (2006.01)
*G01R 31/28*    (2006.01)
(Continued)

(52) U.S. Cl.
CPC ..... *G01R 31/2836* (2013.01); *G01R 31/2829* (2013.01); *G01R 31/40* (2013.01); *G01R 31/06* (2013.01); *G01R 31/343* (2013.01)

(58) Field of Classification Search
CPC ............ G01R 31/2836; G01R 31/2844; G01R 31/2846
See application file for complete search history.

(56) References Cited

U.S. PATENT DOCUMENTS 5,001,714 A * 3/1991 Stark ................. G01R 31/2846
                                                702/117
5,574,346 A    11/1996 Chavan et al.
(Continued)

FOREIGN PATENT DOCUMENTS

BE    WO 2009147146 A1 * 12/2009 ............. F01N 3/208
DE          1997123456 A1    12/1998
(Continued)

OTHER PUBLICATIONS

D. Brown et al., "Particle filter based anomaly detection for aircraft actuator systems," Aerospace conference, 2009 IEEE, Big Sky, MT, 2009, pp. 1-13.*
(Continued)

Primary Examiner — Daniel Miller
(74) Attorney, Agent, or Firm — Oblon, McClelland, Maier & Neustadt, L.L.P.

(57) ABSTRACT

A method for diagnosing an electrical circuit including at least one electrical device, an actuator for the device controlled by a high side actuating switch and a low side actuating switch, and at least one additional switch not in series with any of the HS or LS switch, the method including: to each of the possible statuses of the circuit, giving a code; sequentially putting the circuit in at least some of these statuses for a given time period; during each of these periods, measuring voltage and/or current in different parts of the circuit and giving a code to the measurement; and establishing a diagnosis of correct functioning or of a malfunctioning of at least some elements of the circuit
(Continued)

Table 1

| Signal Name | Description |
|---|---|
| Phase A voltage measurement | Logical Level of the phase A voltage measurement - 0 for U<0,1V; 1 for U>9V; 2 for over current detection |
| Phase B voltage measurement | Logical Level of the phase A voltage measurement - 0 for U<0,1V; 1 for U>9V; 2 for over current detection |
| Phase C voltage measurement | Logical Level of the phase A voltage measurement - 0 for U<0,1V; 1 for U>9V; 2 for over current detection | according to a pre-established correlation between the status codes and the measurement codes.

12 Claims, 41 Drawing Sheets

(51) Int. Cl.
  *G01R 31/40* (2014.01)
  *G01R 31/06* (2006.01)

(56) References Cited

U.S. PATENT DOCUMENTS

| | | | |
|---|---|---|---|
| 6,056,384 | A | 5/2000 | Sato et al. |
| 2004/0145838 | A1 | 7/2004 | Hazelton |
| 2008/0084229 | A1 | 4/2008 | Frommer et al. |
| 2008/0211439 | A1 | 9/2008 | Yokota et al. |
| 2010/0134120 | A1 | 6/2010 | Barcin et al. |

FOREIGN PATENT DOCUMENTS

| | | | |
|---|---|---|---|
| DE | 2003147979 | A1 | 5/2005 |
| DE | 20051004608 | B3 | 4/2006 |
| DE | 20041054374 | B3 | 5/2006 |
| DE | 20081027998 | B3 | 5/2009 |
| DE | 20080442712 | A1 | 6/2010 |
| EP | 1 306 680 | A1 | 5/2003 |
| EP | 1 959 561 | | 8/2008 |
| JP | 2004-257325 | A | 9/2004 |
| WO | 2008 035176 | | 3/2008 |
| WO | WO 2008/129658 | A1 | 10/2008 |

OTHER PUBLICATIONS

International Search Report Issued Feb. 22, 2012 in PCT/EP11/64493 Filed Aug. 23, 2011.
Opponent's Brief in Opposition, filed Apr. 2015 (with English translation) (16 pgs.).
D12 Pflichtenheft Hardware Projekt: ROC (Roll Over Controller) (P0116), vom May 14, 2004, HELBAKO GmbH; D12a: Systemarchitekture ROC (Roll-Over-Controller) (P0116) vom.15, Aug. 15, 2008, HELBAKO GmbH mit Schaltplan; D12b: Data sheet for ROC process series (with English translation).
D13 Pflichtenheft Hardware Projekt: BMW ROC light (P0152) vom 15 Aug. 2008, HELBAKO GmbH D13a : Schaltplan zu P0152;—D13b : Data sheet for the Roc light process series (and its abstract in English).
D14 Dokumentation Selbsttest Projekt: Automatische Kindersitzerkennung II (IEE-0912M) vom 24'März 1999, HELBAKO GmbH; D14a: Initial sample test report dated 6/17.04.2000 (and its abstract in English) D14b: Affidavit from Michael Virnich ( with English translation).
D15: Pflichtenheft-System Details zu Eigendiagnose and "Selftest" (P0173) vom 22. Sep. 2010, HELBAKO GmbH.
D16: lichtenheft-System (P0144) vom 17. Oct. 2006, HELBAKO GmbH.
D17: Beschreibung Anforderungen für Projekt IEE-0917 (P0115) vom 17. Nov. 2005, HELBAKO GmbH.
D18: AMG UFPC Pflichtenheft-Software V1.10 vom 21. Aug. 2008 (P0164), HELBAKO GmbH.
D19: ISO CPOD Software-Dokumentation V1.15 vom 16. Dec. 2009 (P0173), HELBAKO GmbH D19a : ASIC-Dokument zu D19 (P0173).
D20: Affidavit from Opponent Alexander Spanner (and English translation).

* cited by examiner

Fig. 2

Table 1

| Signal Name | Description |
|---|---|
| Phase A voltage measurement | Logical Level of the phase A voltage measurement - 0 for U<0,1V; 1 for U>9V; 2 for over current detection |
| Phase B voltage measurement | Logical Level of the phase A voltage measurement - 0 for U<0,1V; 1 for U>9V; 2 for over current detection |
| Phase C voltage measurement | Logical Level of the phase A voltage measurement - 0 for U<0,1V; 1 for U>9V; 2 for over current detection |

Fig. 3

Table 2

| Phase A voltage measurement | Phase B voltage measurement | Phase C voltage measurement |
|---|---|---|
| 0: U< Umin (9V)<br>1: U> Umin<br>2: Over current | 0: U< Umin<br>1: U> Umin<br>2: Over current | 0: U< Umin<br>1: U> Umin<br>2: Over current |

Fig. 4.1

Table 3.1

Phase A HS:
The Phase A HS has 2 different states:

| State | Description |
|---|---|
| 0 | HS driver not commanded |
| 1 | HS driver commanded |

Fig. 4.2

Table 3.2

Phase A LS:
The Phase A LS has 2 different states:

| State | Description |
|---|---|
| 0 | LS driver not commanded |
| 1 | LS driver commanded |

Fig. 4.3

Table 3.3

Phase B HS:
The Phase B HS has 2 different states:

| State | Description |
|---|---|
| 0 | HS driver not commanded |
| 1 | HS driver commanded |

Fig. 4.4

Table 3.4

Phase B LS:
The Phase B LS has 2 different states:

| State | Description |
|---|---|
| 0 | LS driver not commanded |
| 1 | LS driver commanded |

Fig. 4.5

Table 3.5

Phase C HS:
The Phase B HS has 2 different states:

| State | Description |
|---|---|
| 0 | HS driver not commanded |
| 1 | HS driver commanded |

Fig. 4.6

Table 3.6

Phase C LS:
The Phase B LS has 2 different states:

| State | Description |
|---|---|
| 0 | LS driver not commanded |
| 1 | LS driver commanded |

Fig. 4.7

Table 3.7

Global State:
The global Stat is a combination of the 6 states defined above as following:

| Phase A HS | Phase A LS | Phase B HS | Phase B LS | Phase C HS | Phase C LS |
|---|---|---|---|---|---|
| 0 or 1 | 0 or 1 | 0 or 1 | 0 or 1 | 0 or 1 | 0 or 1 |

Fig. 5

Table 4

| Error name | Error description |
|---|---|
| Dosing pump KS- | Dosing pump Short Circuit to GND (at least one phase) |
| Dosing pump OC | Dosing pump Open Load (at least one phase) |
| Dosing pump KS+ | Dosing pump Short Circuit to VBAT (at least one phase) |

Fig. 6

Table 5

| State | Description | KS- Phase A | KS- Phase B | KS- Phase C | OC Phase A | OC Phase B | OC Phase C | KS+ Phase A | KS+ Phase B | KS+ Phase C |
|---|---|---|---|---|---|---|---|---|---|---|
| 000000 | No command | 000 | 000 | 000 | 000 | 000 | 000 | 1xx | x1x | xx1 |
| 000001 | LS Phase A | 000 | 000 | 000 | 000 | 000 | 000 | 2xx | 01x | 0x1 |
| 000100 | LS Phase B | 000 | 000 | 000 | 000 | 000 | 000 | 10x | x2x | 0x1 |
| 010000 | LS Phase C | 000 | 000 | 000 | 000 | 000 | 000 | 1x0 | 01x | xx2 |
| 000010 | HS Phase A | 200/0xx | 10x | 1x0 | 100 | 101 | 110 | 111 | 111 | 111 |
| 001000 | HS Phase B | 01x | 020/x0x | x10 | 011 | 010 | 110 | 111 | 111 | 111 |
| 100000 | HS Phase C | 0x1 | x01 | 002/xx0 | 011 | 101 | 001 | 111 | 111 | 111 |

Table 6

| Error | Qualification | Disqualification |
|---|---|---|
| KS+ | One phase active (>1V) when not commanded in all 3 cycles<br><br>(command 000000, measurement 1xx or x1x or xx1) | All phases not active when not commanded in all 3 cycles<br><br>(command 000000, measurement 000) |
| KS- | One phase not active (<1V) when one phase commanded and (HS driver over current or the commanded phase is not active)<br><br>(command 000010 or 001000 or 100000 and measurement 2xx / 0xx or x2x / x0x or xx2 / xx0) | All phases active when one phase commanded<br><br>(command 000010, measurement 111 +<br>command 001000, measurement 111 +<br>command 100000, measurement 111) |
| OC | One phase not active (<1V) when one phase commanded and no HS driver over current<br><br>(command 000010, state 0xx or x0x or xx0 +<br>command 001000, state 0xx or x0x or xx0 +<br>command 100000, state 0xx or x0x or xx0) | All phases active when one phase commanded<br><br>(command 000010, measurement 111 +<br>command 001000, measurement 111 +<br>command 100000, measurement 111) |

Fig.11

Table 7

Signals Definition:

| Signal Name | Schematic Name | Description |
|---|---|---|
| U_LineHeater | DIAG_Lines_H | Logical Level of the Line Heater positive Pin - 0 for U<0,1V; 1 for U>9V |
| U_TransferPump | DIAG_Opt_H | Logical Level of the Transfer Pump positive Pin - 0 for U<0,1V; 1 for U>9V |
| U_LowSide | LinesHeatGnd | Logical Level of the Line Heater and transfer Pump negative Pin - 0 for U<0,1V; 1 for U>9V |
| I_LineHeater | I_Lines_H | 3 states logical signal of the Line Heater current seen on the High Side<br>- 0 for I< I_low ( set by calibration);<br>- 1 for I> Out of range Low limit (set by calibration);<br>- 2 in case of overcurrent |
| I_TransferPump | I_OPT_H | 3 states logical signal of the Line Heater current seen on the High Side<br>- 0 for I< I_low ( set by calibration);<br>- 1 for I> Out of range Low limit (set by calibration);<br>- 2 in case of overcurrent |
| LowSide_OverCurrent |  | Logical Level of the Low Side over-current detection<br>- 0 for no over current;<br>- 1 in case of over current |

Fig. 12

Table 8

| U_LineHeater | U_TransferPump | U_LowSide | I_LineHeater | I_TransferPump | LowSide_OverCurrent |
|---|---|---|---|---|---|
| Bit 5 | Bit 4 | Bit 3 | Bit 2 | Bit 1 | Bit 0 |
| 0: U<Umin<br>1: U>9V | 0: U<Umin<br>1: U>9V | 0: U< Umin<br>1: U>9V | 0: I< Imin<br>1: I> Imin<br>2: Overcurrent | 0: I< Imin<br>1: I> Imin<br>2: Overcurrent | 0: no Overcurrent<br>1: Overcurrent |

Fig. 13.1

Table 9.1

LowSide State:
The LowSide has 3 different states:

| State | Description |
|---|---|
| 0 | Both, Main Switch and the Diagnostic Switch are open – (Lines L_EN_H = 0 & EN_DIAG=0) |
| 1 | Main Switch is closed and the Diagnostic Switch is open - (Lines L_EN_H = 1 & EN_DIAG=0)) |
| R | Main Switch is open and the Diagnostic Switch is closed(Lines L_EN_H = 0 & EN_DIAG=1) |

Fig. 13.2

Table 9.2

LineHeater_HighSide State:
The LineHeater_HighSide has 3 different states:

| State | Description |
|---|---|
| 0 | Both, Main Switch and the Diagnostic Switch are open – (Lines_H_EN_H = 0 & EN_DIAG1=0) |
| 1 | Main Switch is closed and the Diagnostic Switch is open - (Lines_H_EN_H = 1 & EN_DIAG1=0)) |
| R | Main Switch is open and the Diagnostic Switch is closed(Lines_H_EN_H = 0 & EN_DIAG1=1) |

Fig. 13.3

Table 9.3

TransferPump_HighSide State:
The TransferPump_HighSide has 3 different states:

| State | Description |
|---|---|
| 0 | Both, Main Switch and the Diagnostic Switch are open – (Opt_H_EN_H = 0 & EN_DIAG2=0) |
| 1 | Main Switch is closed and the Diagnostic Switch is open - (Opt_H_EN_H = 1 & EN_DIAG2=0)) |
| R | Main Switch is open and the Diagnostic Switch is closed(Opt_H_EN_H = 0 & EN_DIAG2=1) |

Fig. 13.4

Table 9.4

Global State:
The global Stat is a 3 bits combination of the above states defined as following:

| LowSide_State | LineHeater_State | TransferPump_State |
|---|---|---|
| Bit 2 | Bit 1 | Bit 0 |
| 0, 1 or R | 0, 1 or R | 0, 1 or R |

Fig. 14

Table 10

Error definition:

| Error name | Error description |
|---|---|
| SC+_LineHeater+ | Line Heater + Short Circuit to Vbat |
| SC+_TransferPump+ | Transfer Pump + Short Circuit to Vbat |
| SC+_LowSide | Line Heater - or Transfer Pump - Short Circuit to Vbat |
| SC-_LineHeater+ | Line Heater + Short Circuit to GND |
| SC-_TransferPump+ | Transfer Pump + Short Circuit to GND |
| SC-_LowSide | Line Heater - or Transfer Pump - Short Circuit to GND |
| OL_LineHeater | Line Heater Open Load |
| OL_TransferPump | Transfer Pump Open Load |
| SC_LineHeater | Short Circuit between Line Heater + and Line Hearter - |
| SC_TransferPump | Short Circuit between Transfer Pump + and Transfer Pump - |

Fig. 15.1

Table 11.1

OFF DETECTION

| State=R00 | LineHeater | | | | | | |
|---|---|---|---|---|---|---|---|
| TransferPump | No Error | SC+_LineHeater+ | SC+_LowSide | SC-_LineHeater+ | SC-_LowSide | OL_LineHeater | SC_LineHeater |
| No Error | 000000 | 111000 | 111000 | 000000 | 000000 | 000000 | 000000 |
| SC+_TransferPump+ | 111000 | 111000 | 111000 | 011000 | 010000 | 011000 | 111000 |
| SC+_LowSide | X | 111000 | X | 011000 | X | 011000 | 111000 |
| SC-_TransferPump+ | 000000 | 101000 | 101000 | 000000 | 000000 | 000000 | 000000 |
| SC-_LowSide | X | 101000 | X | 000000 | X | 000000 | 000000 |
| OL_TransferPump | 000000 | 101000 | 101000 | 000000 | 000000 | 000000 | 000000 |
| SC_TransferPump | 000000 | 111000 | 111000 | 000000 | 000000 | 000000 | 000000 |

Fig. 15.2

Table 11.2

| State=100 | LineHeater | | | | | | |
|---|---|---|---|---|---|---|---|
| TransferPump | No Error | SC+_ LineHeater+ | SC+_ LowSide | SC-_ LineHeater+ | SC-_ LowSide | OL_ LineHeater | SC_ LineHeater |
| No Error | 000000 | 100000 | 111001 | 000000 | 000000 | 000000 | 000000 |
| SC+_ TransferPump+ | 010000 | 110000 | 111001 | 010000 | 010000 | 010000 | 010000 |
| SC+_ LowSide | × | 111001 | × | 011001 | × | 011001 | 111001 |
| SC-_ TransferPump+ | 000000 | 100000 | 101001 | 000000 | 000000 | 000000 | 000000 |
| SC-_ LowSide | × | 100000 | × | 000000 | × | 000000 | 000000 |
| OL_ TransferPump | 000000 | 100000 | 101001 | 000000 | 000000 | 000000 | 000000 |
| SC_ TransferPump | 000000 | 100000 | 111001 | 000000 | 000000 | 000000 | 000000 |

Fig. 15.3

Table 11.3

| State=011 | LineHeater | | | | | | |
|---|---|---|---|---|---|---|---|
| TransferPump | No Error | SC+_ LineHeater+ | SC+_ LowSide | SC-_ LineHeater+ | SC-_ LowSide | OL_ LineHeater | SC_ LineHeater |
| No Error | 111000 | 111000 | 111000 | 01?210 | 110210 | 111000 | 111000 |
| SC+_ TransferPump+ | 111000 | 111000 | 111000 | 01?200 | 110100 | 111000 | 111000 |
| SC+_ LowSide | × | 111000 | × | 01?200 | × | 111000 | 111000 |
| SC-_ TransferPump+ | 10?120 | 10?020 | 10?020 | 00?220 | 10?120 | 10?020 | 10?120 |
| SC-_ LowSide | × | 110010 | × | 01?210 | × | 110010 | 010210 |
| OL_ TransferPump | 111000 | 111000 | 111000 | 01?200 | 110100 | 110010 | 111000 |
| SC_ TransferPump | 111000 | 111000 | 111000 | 01?210 | 100120 | 111000 | 111000 |

Fig. 15.4

Table 11.4

| State=00R | LineHeater | | | | | | |
|---|---|---|---|---|---|---|---|
| TransferPump | No Error | SC+_ LineHeater+ | SC+_ LowSide | SC-_ LineHeater+ | SC-_ LowSide | OL_ LineHeater | SC_ LineHeater |
| No Error | 111000 | 111000 | 111000 | 000000 | 000000 | 011000 | 111000 |
| SC+_ TransferPump+ | 111000 | 111000 | 111000 | 01?000 | 010000 | 011000 | 111000 |
| SC+_ LowSide | ✗ | 111000 | ✗ | 011000 | ✗ | 011000 | 111000 |
| SC-_ TransferPump+ | 000000 | 101000 | 101000 | 000000 | 000000 | 000000 | 000000 |
| SC-_ LowSide | ✗ | 100000 | ✗ | 000000 | ✗ | 000000 | 000000 |
| OL_ TransferPump | 010000 | 111000 | 111000 | 010000 | 010000 | 010000 | 010000 |
| SC_ TransferPump | 111000 | 111000 | 111000 | 000000 | 000000 | 011000 | 111000 |

Fig. 15.5

Table 11.5

| State=0R0 | LineHeater | | | | | | |
|---|---|---|---|---|---|---|---|
| TransferPump | No Error | SC+_ LineHeater+ | SC+_ LowSide | SC-_ LineHeater+ | SC-_ LowSide | OL_ LineHeater | SC_ LineHeater |
| No Error | 111000 | | | | | | |
| SC+_ TransferPump+ | | | | 01?000 | 010000 | 111000 | |
| SC+_ LowSide | ✗ | | ✗ | 11000 | ✗ | 111000 | |
| SC-_ TransferPump+ | 000000 | | | | | 100000 | 000000 |
| SC-_ LowSide | ✗ | | ✗ | | ✗ | | |
| OL_ TransferPump | 101000 | | | | 000000 | | |
| SC_ TransferPump | | | | 000000 | | 100000 | |

Fig. 15.6

Table 11.6
    Line heater ON DETECTION

| State = 110 | LineHeater | | | | | | |
|---|---|---|---|---|---|---|---|
| TransferPump | No Error | SC+_ LineHeater+ | SC+_ LowSide | SC-_ LineHeater+ | SC-_ LowSide | OL_ LineHeater | SC_ LineHeater |
| No Error | 100100 | 100000 | 111001 | 000200 | 100100 | 100000 | 111001 |
| SC+_ TransferPump+ | 110100 | 110000 | 111001 | 010200 | 110100 | 110000 | 111001 |
| SC+_ LowSide | ✕ | 111001 | ✕ | 011001 | ✕ | 111001 | 111001 |
| SC-_ TransferPump+ | 100100 | 100000 | 101001 | 000200 | 100100 | 100000 | 101001 |
| SC-_ LowSide | ✕ | 100000 | ✕ | 000200 | ✕ | 100000 | 000200 |
| OL_ TransferPump | 100100 | 100000 | 101001 | 000200 | 100100 | 100000 | 101001 |
| SC_ TransferPump | 100100 | 100000 | 111001 | 000200 | 100100 | 100000 | 111001 |

Fig. 15.7

Table 11.7

| State = 11R | LineHeater | | | | | | |
|---|---|---|---|---|---|---|---|
| TransferPump | No Error | SC+_ LineHeater+ | SC+_ LowSide | SC-_ LineHeater+ | SC-_ LowSide | OL_ LineHeater | SC_ LineHeater |
| No Error | 100100 | | | | 100100 | | |
| SC+_ TransferPump+ | | | | | | | |
| SC+_ LowSide | ✕ | | ✕ | | ✕ | | |
| SC-_ TransferPump+ | 100100 | | | | 100100 | | |
| SC-_ LowSide | ✕ | | ✕ | | ✕ | | |
| OL_ TransferPump | 101100 | | | | 101100 | | |
| SC_ TransferPump | 100100 | | | | 100100 | | |

Fig. 15.8

Table 11.8
Tranfer Pump ON DETECTION

| State = 101 | LineHeater | | | | | | |
|---|---|---|---|---|---|---|---|
| TransferPump | No Error | SC+_ LineHeater+ | SC+_ LowSide | SC-_ LineHeater+ | SC-_ LowSide | OL_ LineHeater | SC_ LineHeater |
| No Error | 010010 | 110010 | 111001 | 010010 | 010010 | 010010 | 010010 |
| SC+_ TransferPump+ | 010000 | 110000 | 111001 | 010000 | 010000 | 010000 | 010000 |
| SC+_ LowSide | ✗ | 111001 | ✗ | 010001 | ✗ | 011001 | 111001 |
| SC-_ TransferPump+ | 000020 | 100020 | 101021 | 000020 | 000020 | 000020 | 000020 |
| SC-_ LowSide | ✗ | 110010 | ✗ | 010010 | ✗ | 010010 | 010010 |
| OL_ TransferPump | 010000 | 110000 | 111001 | 010000 | 010000 | 010000 | 010000 |
| SC_ TransferPump | 111001 | 111001 | 111001 | 010001 | 000020 | 011001 | 111001 |

Fig. 15.9

Table 11.9

| State = 1R1 | LineHeater | | | | | | |
|---|---|---|---|---|---|---|---|
| TransferPump | No Error | SC+_ LineHeater+ | SC+_ LowSide | SC-_ LineHeater+ | SC-_ LowSide | OL_ LineHeater | SC_ LineHeater |
| No Error | 010010 | | | 010010 | 010010 | 010010 | 010010 |
| SC+_ TransferPump+ | | | | | | | |
| SC+_ LowSide | | | ✗ | | ✗ | | |
| SC-_ TransferPump+ | | | | | | | |
| SC-_ LowSide | ✗ | | ✗ | 010010 | ✗ | 010010 | 010010 |
| OL_ TransferPump | | | | | | | |
| SC_ TransferPump | | | | | | | |

Fig. 15.10

Table 11.10
Tranfer Pump & Line Heater ON DETECTION

| State= 111 | LineHeater | | | | | | |
|---|---|---|---|---|---|---|---|
| TransferPump | No Error | SC+_ LineHeater+ | SC+_ LowSide | SC-_ LineHeater+ | SC-_ LowSide | OL_ LineHeater | SC_ LineHeater |
| No Error | 110110 | 110010 | 111001 | 010210 | 110110 | 110010 | 111001 |
| SC+_ TransferPump+ | 110100 | 110000 | 111001 | 010200 | 110100 | 110000 | 111001 |
| SC+_ LowSide | ✕ | 111001 | ✕ | 011201 | ✕ | 111001 | 111001 |
| SC-_ TransferPump+ | 100120 | 100020 | 101021 | 000220 | 100120 | 100020 | 101021 |
| SC-_ LowSide | ✕ | 110010 | ✕ | 010210 | ✕ | 110010 | 100020 |
| OL_ TransferPump | 110100 | 110000 | 111001 | 010200 | 110100 | 110000 | 111001 |
| SC_ TransferPump | 111001 | 111001 | 111001 | 011201 | 010200 | 111001 | 111001 |

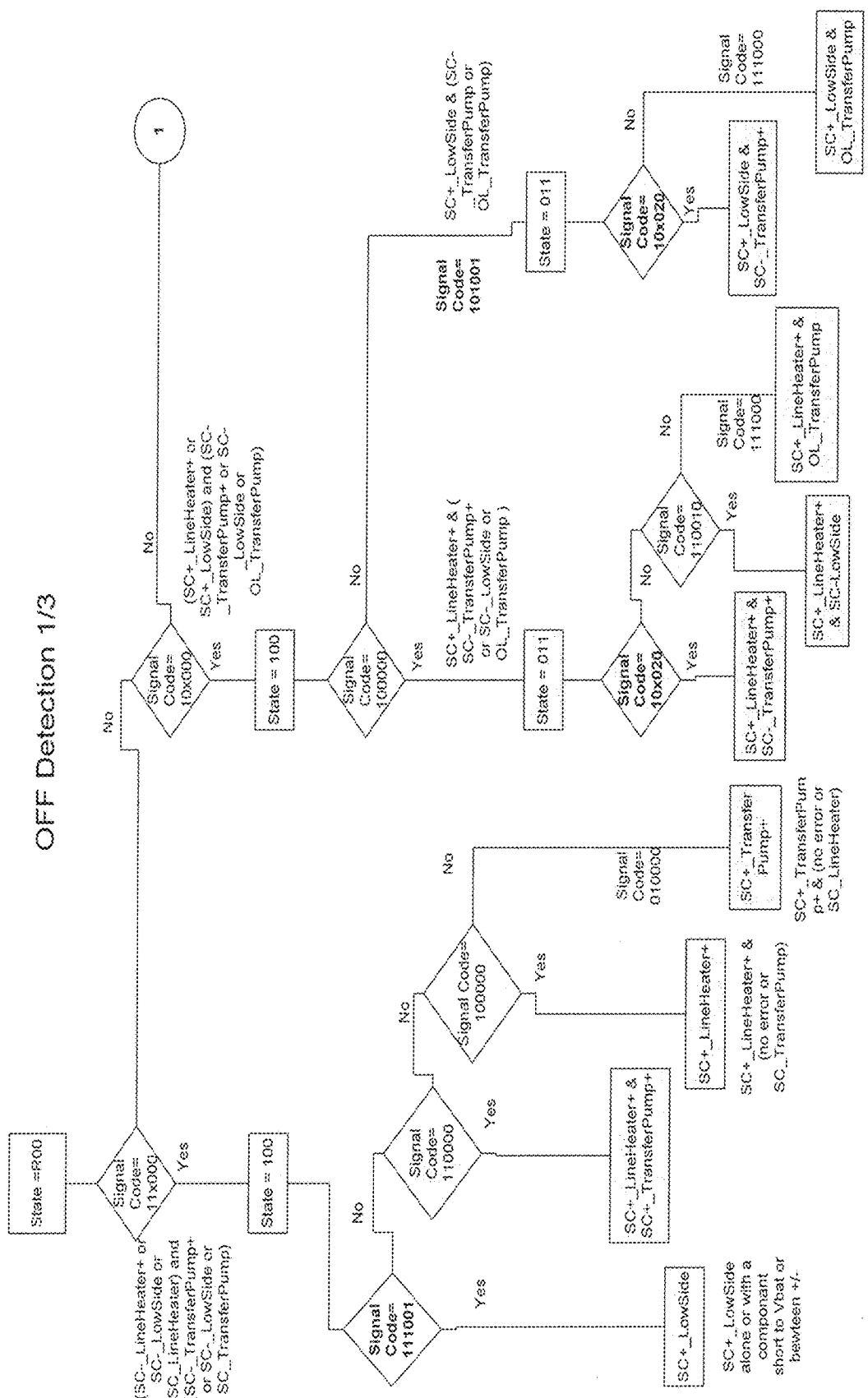

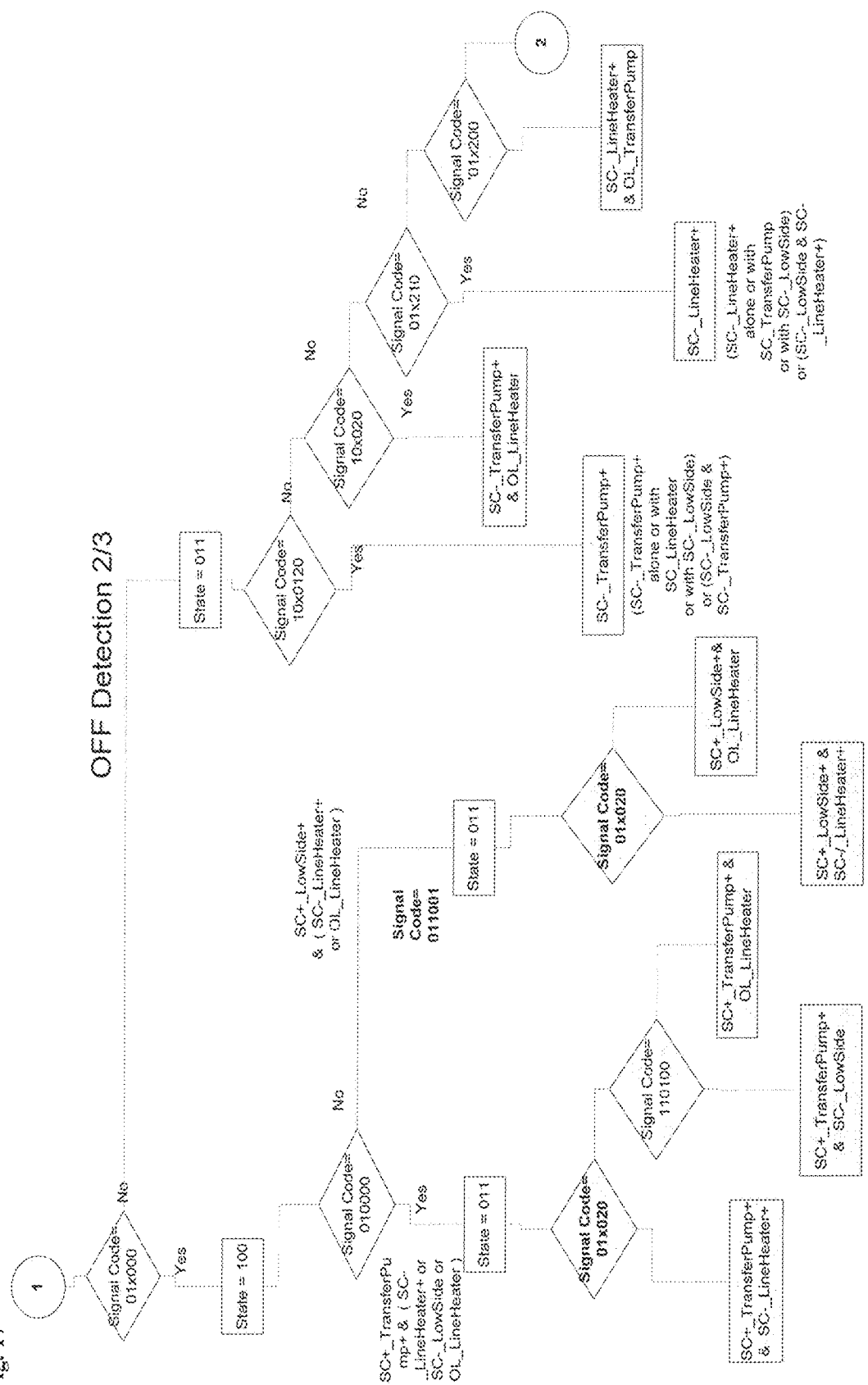

Fig. 19 Line Heater ON Detection 1/4

Fig. 28 — TransferPump & LineHeater ON Detection 2/4

Fig. 32

Table 12

Signals Definition:

| Signal Name | Schematic Name | Description |
|---|---|---|
| U_TankHeater+ | Diag_TANK_H | Logical Level of the Tank Heater positive Pin - 0 for U<0,1V; 1 for U>9V |
| U_TankHeater- | Diag_TANK_H | Logical Level of the Tank Heater negative Pin - 0 for U<0,1V; 1 for U>9V |
| I_TankHeater | I_Tank_H | Three states logical signal of the Tank Heater current seen on the High Side - 0 for I< 0,1A; 1 for I> Out of range Low limit; 2 in case of overcurrent |
| LowSide_OverCurrent | Tank_L_SC | Logical Level of the Low Side overcurrent detection - 0 for no over current; 1 in case of over current |

Fig. 33

Table 13

| U_TankHeater+ | U_TankHeater- | I_TankHeater | LowSide_OverCurrent |
|---|---|---|---|
| 0: U<Umin<br>1: U>9V | 0: U<Umin<br>1: U>9V | 0: I< Imin<br>1: I> Imin<br>2: Overcurrent | 0: no Overcurrent<br>1: Overcurrent |

Fig. 34.1

Table 14.1

LowSide State:
The TankHeater_LowSide has 3 different states:

| State | Description |
|---|---|
| 0 | Both, Main Switch and the Diagnostic Switch are open – (Tank_L_EN_H = 0 & EN_DIAG=0) |
| 1 | Main Switch is closed and the Diagnostic Switch is open - (Tank_L_EN_H = 1 & EN_DIAG=0)) |
| R | Main Switch is open and the Diagnostic Switch is closed(Tank_L_EN_H = 0 & EN_DIAG=1) |

Fig. 34.2

Table 14.2

TankHeater_HighSide State:
The TankHeater_HighSide has 3 different states:

| State | Description |
|---|---|
| 0 | Both, Main Switch and the Diagnostic Switch are open – (Tank_H_EN_H = 0 & EN_DIAG2=0) |
| 1 | Main Switch is closed and the Diagnostic Switch is open - (Tank_H_EN_H = 1 & EN_DIAG2=0)) |
| R | Main Switch is open and the Diagnostic Switch is closed(Tank_H_EN_H = 0 & EN_DIAG2=1) |

Fig. 34.3

Table 14.3

Global State:
The global Stat is a combination of the 2 states defined above as following:

| TH_LowSide_State | TH_HighSide_State |
|---|---|
| 0, 1 or R | 0, 1 or R |

Fig. 35

Table 15

Error definition:

| Error name | Error description |
|---|---|
| SC+_TankHeater+ | Tank Heater + Short Circuit to Vbat |
| SC+_TankHeater- | Tank Heater - Short Circuit to Vbat |
| SC-_TankHeater+ | Tank Heater + Short Circuit to GND |
| SC-_TankHeater- | Tank Heater - Short Circuit to GND |
| OL_TankHeater | Tank Heater Open Load |
| SC_TankHeater | Short Circuit between Tank Heater + and Tank Hearter - |

Fig. 36
Table 16

METHOD FOR DIAGNOSING AN ELECTRICAL CIRCUIT

BACKGROUND OF THE INVENTION

Field of the Invention

The present application relates to a method for diagnosing an electrical circuit and in particular, an electrical circuit for at least one component of an SCR system like a BLDC motor of a pump intended for aqueous urea solutions, an injector, a line or a tank heater for such a system.

Description of Related Art

Legislation on vehicle and heavy goods vehicle emissions stipulates, amongst other things, a reduction in the release of nitrogen oxides $NO_x$ into the atmosphere. One known way to achieve this objective is to use the SCR (Selective Catalytic Reduction) process which enables the reduction of nitrogen oxides by injection of a reducing agent, generally ammonia, into the exhaust line.

This ammonia may derive from the pyrolytic decomposition of an ammonia precursor solution, whose concentration may be the eutectic concentration. Such an ammonia precursor is generally a urea solution.

With the SCR process, the high levels of $NO_x$ produced in the engine during combustion at optimized efficiency are treated in a catalyst on exiting the engine. This treatment requires the use of the reducing agent at a precise concentration and of extreme quality. The solution is thus accurately metered and injected into the exhaust gas stream where it is hydrolysed before converting the nitrogen oxide ($NO_x$) to nitrogen ($N_2$) and water ($H_2O$).

In order to do this, it is necessary to equip the vehicles with a tank containing an additive solution (generally an aqueous urea solution) and also, with a pump for conveying this solution to the exhaust pipe.

The OBD II requirements from CARB (California Air Resources Board, which is responsible for the OBDII specification) request explicitly that all components have to be diagnosed each power cycle i.e. every time the engine is switched on and off (thus also in cold conditions when the pump is not activated) and also, periodically (for instance: every 30 minutes).

In order to do that, current and/or voltage measurements can be used. However, since generally the components have (or are connected to) a rather complicated electrical circuit comprising different branches and devices, a single static measurement of the voltage and/or current in the different branches or devices will note enable to differentiate from one error to another.

BRIEF SUMMARY OF THE INVENTION

The present invention aims at solving that problem by providing such a method i.e. a diagnostic method allowing to detect which part of the circuit is malfunctioning. It is based on the idea of putting switches in the circuit in order to be able to sequentially activate and deactivate some branches thereof so as to put said circuit in different statuses during each of which several current/voltage measurements are performed. By correlating the statuses and the measurements, it appears to be possible to differentiate most (and sometimes even all) of the errors one from another.

For this purpose, the present application relates to a method for diagnosing an electrical circuit comprising at least one electrical device and an actuator for said device controlled by a high side (HS) switch and a low side (LS) switch (which actually are the actuating switches of the device), according to which:

- the system is provided with at least one additional switch not being in series with any of the HS or LS switch;
- to each of the possible statuses of the circuit, a code is given;
- the circuit is sequentially put in at least some of these statuses for a given time period;
- during each of these periods, the voltage and/or the current is measured in different parts of the circuit and a code is given to said measurement;
- a diagnosis of correct functioning or of a malfunctioning of at least some elements of the circuit is established according to a pre-established correlation between the status codes and the measurement codes.

The method of the invention applies to an electrical circuit i.e. an electrical wiring system comprising at least one electrical device (magnetic coil, heater, pump . . . ) which is actuated (put ON or OFF i.e. through which current is circulated or not) thanks to an actuator which is therefore connected respectively to a power supply (like a battery in the case of a circuitry on board of a vehicle, like one of an SCR system) through a high side (HS) switch and to the ground through a low side (LS) switch. In some embodiments, in order to save parts and money, at least 2 actuators of 2 different devices may share the same LS switch.

According to the invention, each HS and LS switch can be in at least 2 different statuses (activated when the switch is closed, and inactivated when the switch is open) and the system comprises at least one additional switch not in series with said HS and LS switches in order to increase the number of statuses and measurements in order to be able to maximize error detection and recognition (differentiation). The number of different statuses of the complete electrical circuit corresponds in fact to the number of possible combinations of the statutes of each switch.

Generally, the method of the invention is implemented via at least one PCB (Printed Circuit Board) comprising the above mentioned switches. This or these PCBs are generally connected to a controller that actuates the switches, records the measurement signals, generates the status and measurement codes and performs the diagnosis by correlating the status codes and the measurement codes.

BRIEF DESCRIPTION OF THE SEVERAL VIEWS OF THE DRAWINGS

The present invention will be described in more details with reference to some embodiments supported by the Figures and Tables attached to the present specification, the features of which are not intended to limit the scope of the invention.

FIG. 2 shows Table 1,

FIG. 3 shows Table 2, tables 1 and 2 show the measurement steps of said method and how a code is generated accordingly.

FIGS. 4.1, 4.2, 4.3, 4.4, 4.5, 4.6, 4.7 shows Tables 3.1, 3.2, 3.3, 3.4, 3.5, 3.6, 3.7 which show how a status code is associated to the different measurement steps.

FIG. 5 shows Table 4, which shows the types of errors that can be detected in the method of that embodiment.

FIG. 6 shows Table 5, which shows the possible measurement codes associated with each status code and the possible errors associated therewith.

FIG. 11 shows Table 7,

FIG. 12 shows Table 8, tables 7 and 8 show the measurement steps of said method and how a code is generated accordingly.

FIGS. 13.1, 13.2, 13.3, 13.4 show Tables 9.1, 9.2, 9.3, 9.4, which show how a status code is associated to the different measurement steps.

FIG. 14 shows Table 10, which shows the types of errors that can be detected in the method of that embodiment.

FIG. 15.1, 15.2, 15.3, 15.4, 15.5, 15.6, 15.7, 15.8, 15.9, 15.10 shows Tables 11.1, 11.2, 11.3, 11.4, 11.5, 11.6, 11.7, 11.8, 11.9, 11.10 which show the possible measurement codes associated with each status code and the possible errors associated therewith.

FIGS. 16 to 30 show the logic diagram leading to the detection and identification of the errors.

FIG. 32 shows Table 12,

FIG. 33 shows Table 13, tables 12 and 13 show the measurement steps of said method and how a code is generated accordingly.

FIGS. 34.1, 34.2, 34.3 show Tables 14.1, 14.2, 14.3, which show how a status code is associated to the different measurement steps.

FIG. 35 shows Table 15, which shows the types of errors that can be detected in the method of that embodiment.

FIG. 36 shows Table 16, which shows the possible measurement codes associated with each status code and the possible errors associated therewith.

DETAILED DESCRIPTION OF THE INVENTION

Figure 1:
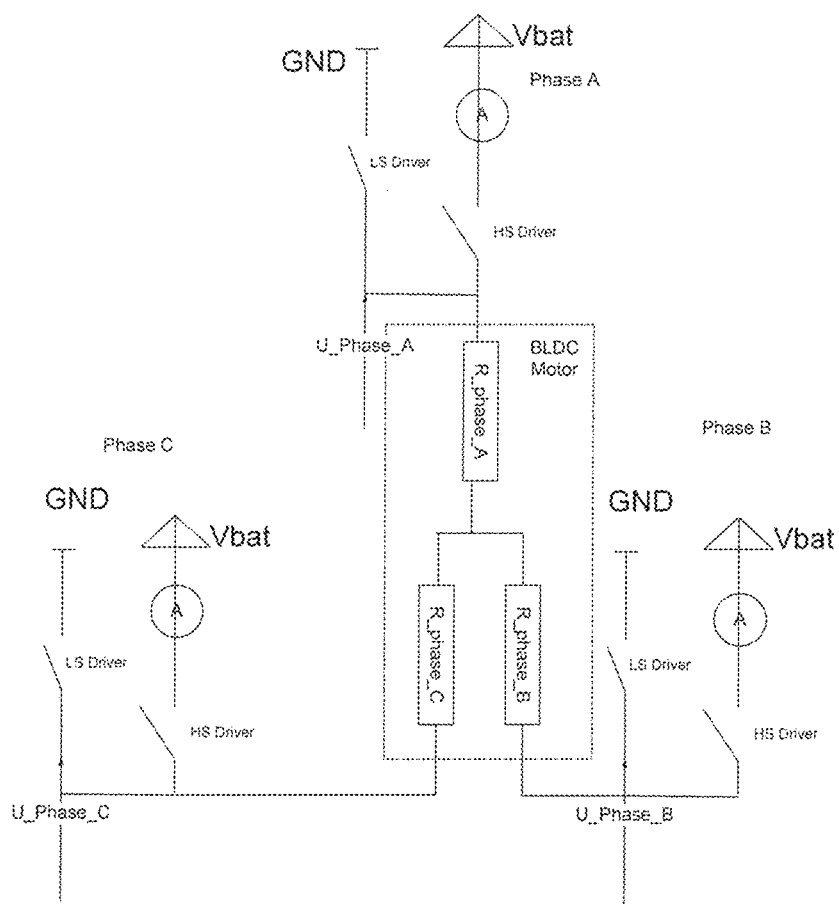
FIG. 1 shows a first electrical circuit to which a method according to a first embodiment of the invention can be applied.

As explained above, the method of the invention can be applied to (parts of) electrical circuits of systems that must be diagnosed periodically like SCR systems on board of vehicles.

A device to which the method of the invention can be applied, is for instance the motor of a pump, for instance a pump which supplies reducing agent (urea/water solution generally) in exhaust gases of an engine, preferably onboard of a vehicle.

One type of pump that is very efficient is composed of a rotary pump driven by a brushless direct current (BLDC) motor. In such a motor, the rotor is rotated by the sequential switching (activating according to a defined timing) of electromagnetic coils placed in the stator. Each of these coils is generally connected to a power supply and to the ground.

The main errors that can happen on such a motor are the following:
shortcut of one phase to power supply
shortcut of one phase to ground
one phase disconnected.

In order to diagnose this motor, i.e. to check its correct functioning, some algorithms and methods using them have been provided, which are relatively easy to implement while the pump is running (rotating). However, recently, some car manufacturers have emitted the requirement to be able to diagnose said pump also when it is not rotating. Also, a requirement has come up as to detecting the nature of the error.

Hence, according to a first embodiment, the present application relates to a method for diagnosing a motor comprising at least 3 electrical phases (A, B, C) connected in star, according to which:
each phase is sequentially activated (connected to a power supply), then grounded, while the others remain inactivated;
to each activation and grounding step, a status code is given;
during each activation and grounding step, the voltage is measured in each of the phases and a code is given to said measurement;
a diagnosis of correct functioning or of malfunctioning of each of the phases of the motor is established according to a correlation table between the status codes and the measurement codes.

The motor to which this embodiment of the invention applies is preferably a BLDC motor comprising at least one magnetic coil in each phase and which is generally controlled by a controller. This motor may be an internal or external rotor motor. Preferably, it is an internal rotor motor. Preferably, and each phase comprises at least one magnetic coil.

The stator of this motor comprises at least 3 coils in order to have at least 3 phases which may be assembled in star or triangle configuration. This stator therefore comprises, in general, a multiple of 3 coils, generally 3, 6 or 9. Good results have been obtained with a motor having an internal rotor and a stator comprising 9 coils positioned uniformly around the rotor, and being connected so as to form 3 phases (i.e. each phase (A, B or C) comprising 3 coils, and said coils being uniformly positioned around the rotor in the order A, B, C, A, B, C, A, B, C).

The method of this embodiment of the invention gives good results with motors having 3 phases (A, B, C) connected in star.

The motor to which it applies is preferably designed in order to be able to operate a pump and preferably, a pump able to rotate in two opposite rotational directions, one generally corresponding to supplying a feed line with liquid and the other generally corresponding to a purge of the feed line (and of the accessories found therein). In practice, this may be easily achieved by reversing the activation sequence of the coils (phases).

Preferably, the rotary pump is of the gear pump type. These pumps actually have the advantage of providing identical pumping efficiency in both directions of rotation.

The controller of this pump is a control module (generally comprising a PID (proportional-integral-derivative) regulator and a motor rotational speed controller) and an electric power supply unit which preferably supplies the motor with the power required to rotate it at the desired speed and which enables its direction of rotation to be reversed, where necessary.

Most particularly preferably, an ECM (Electronic Control Module) sends to the pump controller, a CAN (Controller Area Network) message or a PWM (Pulse Width Modulation) control signal having a duty cycle that varies as a function of the desired operating conditions for the pump and the controller then acts on the motor to apply said operating conditions to the pump. Such a system is the subject of Application FR 0700358 in the name of the Applicant, the subject of which is incorporated by reference in the present application.

The pump controller interprets this CAN message or PWM-type signal and, depending on the CAN information or on the duty cycle, stops the pump or switches the phases (the coils) in order to regulate the pressure requested or in order to purge the system or in order to heat the pump.

The motor to which the method according to this embodiment of the invention applies is preferably intended to a pump for pumping (transporting) a liquid in freezing conditions, that is to say when the temperature reaches a low temperature threshold and when the liquid is capable of freezing or solidifying. These may, for example, be aqueous solutions. One liquid to which the present invention applies particularly well is urea.

The term "urea" is understood to mean any, generally aqueous, solution containing urea. The invention gives good results with eutectic water/urea solutions for which there is a quality standard: for example, according to the standard DIN 70070, in the case of the AdBlue® solution (commercial solution of urea), the urea content is between 31.8% and 33.2% (by weight) (i.e. 32.5+/−0.7 wt %) hence an available amount of ammonia between 18.0% and 18.8%. The invention may also be applied to the urea/ammonium formate mixtures, also in aqueous solution, sold under the trade name Denoxium™ and of which one of the compositions (Denoxium-30) contains an equivalent amount of ammonia to that of the AdBlue® solution. The latter have the advantage of only freezing from −30° C. onwards (as opposed to −11° C.), but have the disadvantages of corrosion problems linked to the possible release of formic acid and a less available market (whereas urea is widely used and readily available even in fields such as agriculture). The present invention is particularly advantageous in the context of eutectic water/urea solutions.

Preferably, the motor to which the method of this embodiment of the invention applies has a preheating mode during which current is passed through at least one coil (preferably, through all of them) but in a way such that the rotor doesn't rotate. On the contrary, during the operation of the pump, current passes through the coils according to a sequence such that the electromagnetic force or forces generated have a tangential component so as to create a permanent rotational torque. In the case of a motor having 3 coils, it is sufficient, for example, to activate each coil in turn, in a given direction (clockwise or anti-clockwise), while deactivating the other 2, to generate such a torque. In the case of a pump with 9 coils and 3 phases as described above, each phase can be activated in turn for instance.

In order not to generate a permanent torque while getting a heating effect, it is possible, during each heating cycle, to activate the coils (phases) according to a given sequence (time scheme) not generating any torque, or randomly.

Alternatively, during each heating cycle, some of the coils (phases) may be powered constantly, while some others are not. This embodiment is preferred because in the former one, at each switch (change of coils which are activated), a punctual torque is generated, which can lead to mechanical tensions if the pump is actually blocked with frozen liquid. In an even more preferred embodiment, the coils which are permanently powered during each heating cycle are memorized by the controller and in the next heating cycle, at least some of them are put at rest while others (at rest in the first heating cycle) are activated. This embodiment has the advantage of being simpler and of not ageing too much specific coils i.e. of spreading the wear owed to the heating process on all the coils. For example, in the above described pump with 9 coils and 3 phases, the following heating cycles may be repeated (in terms of phases activated continuously during a given cycle): A & B, A & C, B & C. Alternatively, the controller may randomly choose 2 phases to power in each heating cycle.

It results from the above that the method of this embodiment of the invention can also be applied while the pump is preheating.

The method according to this embodiment of the invention will be described more in detail below for the specific case (example) of a 3 phase BLDC motor, the electric circuitry of which is depicted in FIG. 1 attached. This example is purely illustrative and none of the specific features thereof (number of phases, codes used, specific algorithms . . . ) should be seen as limiting the scope of the invention.

The hardware associated with that circuitry provides the following possibilities:
  one high side driver for each phase, which allows to perform the activation steps
  one low side driver for each phase, which allows to perform the grounding steps
  one current measurement plus over current detection/protection.

Hence, that circuitry comprises 3 actuators (one for each phase of the motor) having each their HS and LS switch.

The sequence of steps applied while the pump is not rotating, satisfies the following needs:
  all phases need to be activated to allow shortcut to ground/open load detection
  no command or low side activation is needed to detect shortcut to power supply.

This sequence hence comprises the following steps:
  Step 1—High side phase A active
  Step 2—None of the phases are active (all sides of all phases are inactive). Alternatively phase A low side may be active i.e. phase A may be grounded.
  Step 3—High side phase B active
  Step 4—None of the phases are active (all sides of all phases are inactive). Alternatively phase B low side may be active i.e. phase B may be grounded.
  Step 5—High side phase C active
  Step 6—None of the phases are active (all sides of all phases are inactive). Alternatively phase C low side may be active i.e. phase C may be grounded.

Grounding one phase may allow reaching quicker 0V (i.e. to unload the phases in between two activation steps) but implies a risk of over current in case of shortcut to battery.

Using this sequence, the pump will not turn and no activation is visible from the outside. The initial phase where all the preliminary checks (e.g power supply) are done is not described in this sequence, but is applied in practice.

During each of the above mentioned steps, the voltage is measured in each of the phases and a code is generated according Tables 1 and 2 attached. As can be seen from these Tables, after a given phase has been activated or grounded, the voltage is measured in the commanded phase and in the 2 other ones and to each of the 3 measurements, a one digit code is given so that for each of the above mentioned steps, a measurement code with 3 digits is generated. In our example, this one digit code is 0 if the measured voltage U is below a given minimum (0.1V in our example), 1 if it is above a given value (9V in our example) and 2 if there is an over current detection. The values of 0.1 and 9V are calibration parameters which must be adapted to the OEM specifications.

Besides, to each step of the sequence, a status code is associated as set forth in Tables 3.1 to 3.7. This code is a 6 digit code indicating which side (low or high) of which phase has been activated. More precisely: all 6 digits are equal to 0 in step 0, one of them is equal to 1 in step 1, while the others are equal to 0; and the same for each step, the digit being equal to 1 (while the others are equal to 0) being different for each step.

The errors defined in Table 4 can be detected as follows:
 shortcuts to power supply will be detected when none of the BLDC motor phases are commanded and a certain voltage is measured on any of the phases. Alternatively the low sides could be used to avoid timing problems (pull-downs should bring the actual voltage to 0 faster than no command);
 shortcuts to ground are detected when 1 phase is commanded (high side active) and we have an over current shutdown OR the commanded phase voltage remains at a very low voltage. When a phase is shorted to ground, the measured value will remain to 0 when we try to activate it. Additionally the over current protection will get activated (timing of the over current protection is depending on the actual circuit)
 open circuits are detected when one phase is commanded (high side active) and no voltage is measured on the other phases. Additionally, when another phase than the not connected one is commanded, the not connected phase will show 0V. When a phase is not connected, the measured value will switch to VBAT value when we try to activate it. But since the phase is disconnected, the VBAT will not "go" to the other phases Table 5 shows the possible measurement codes associated with each status code and the possible errors associated therewith. In this Table, x stands for 0 or 1.

Figure 7:
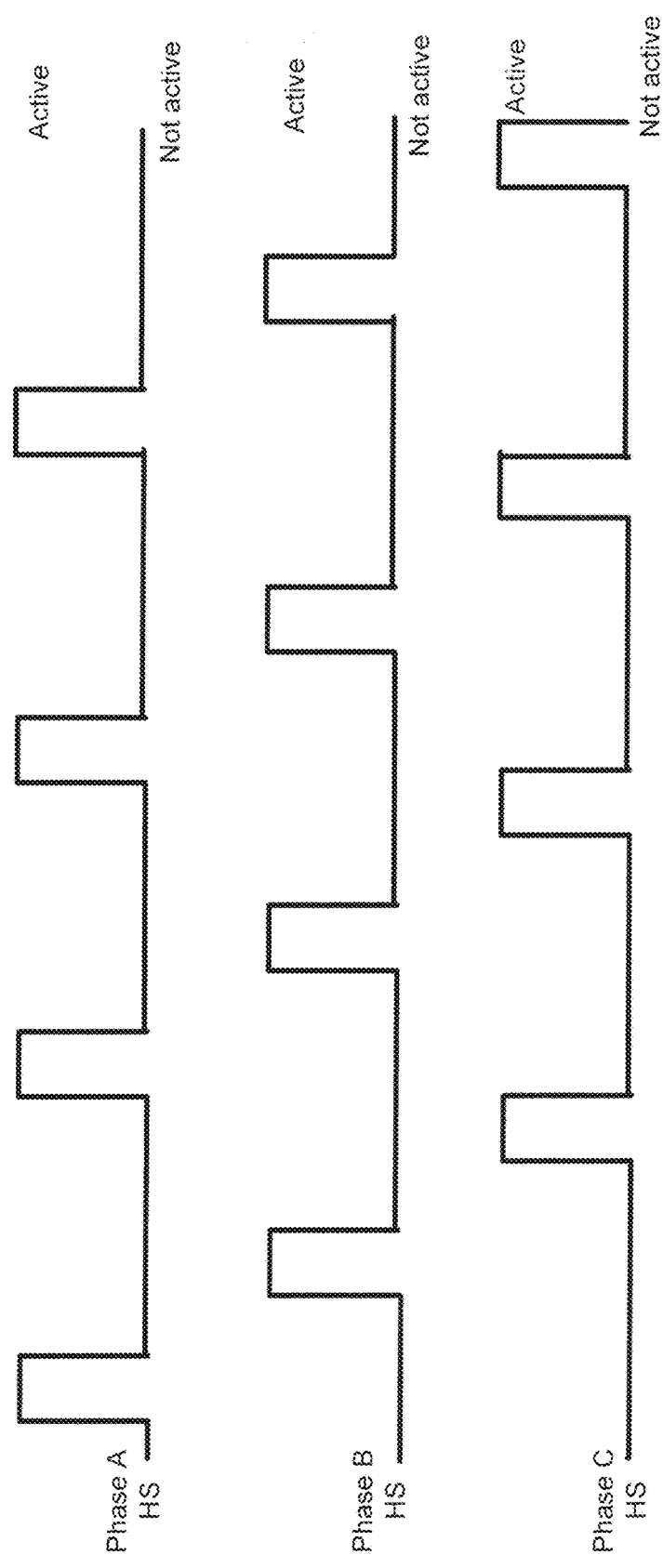
FIG. 7 shows a repetitive activation sequence that can be used in practice.
Figure 8:
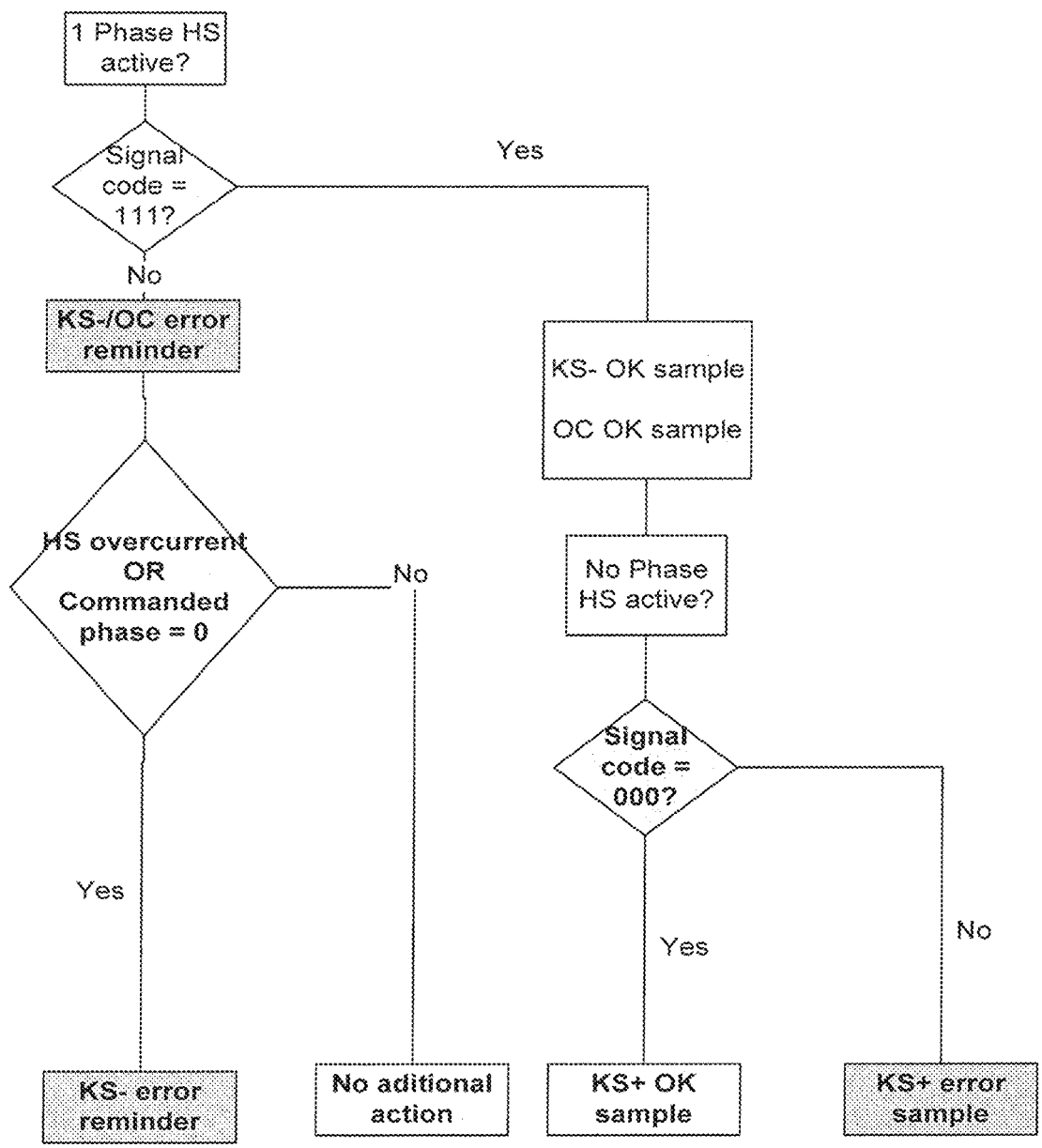
FIGS. 8.1 and 8.2 show the logic diagrams leading to the detection and identification of the errors.
Figure 9:
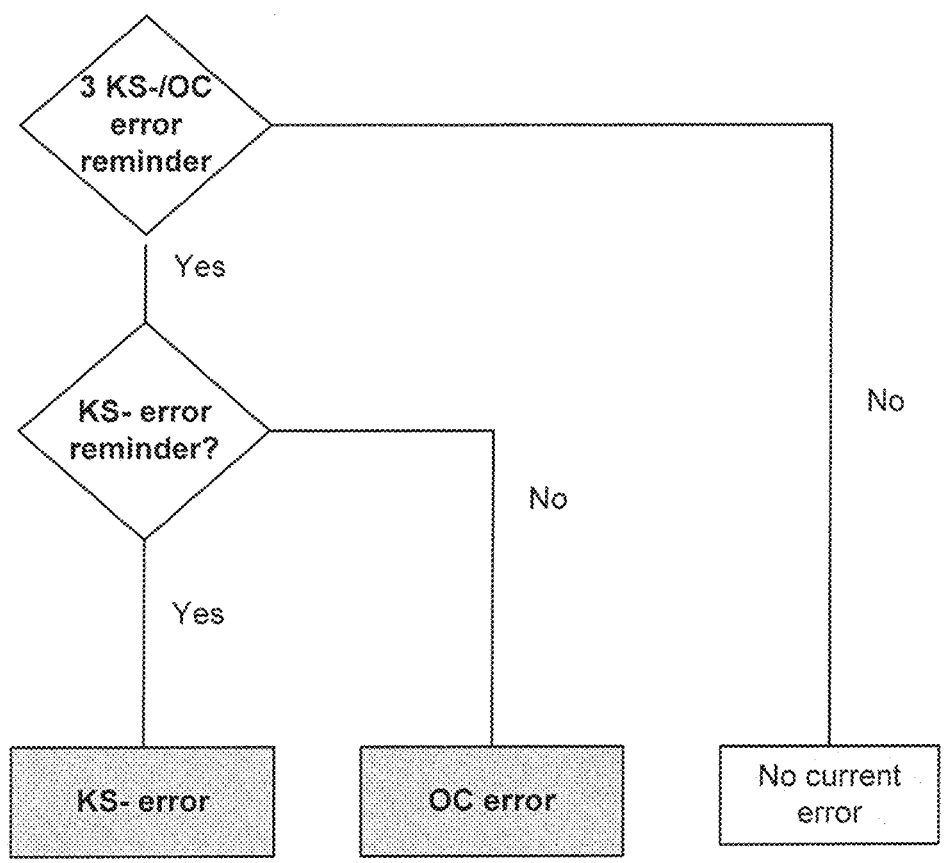
FIG. 9 show Table 6, which is a summary of said errors and codes associated therewith.

To perform the motor diagnosis every 300 ms, the repetitive activation sequence showed in FIG. 7 can be used, in which each phase is activated sequentially for 50 ms.

For each individual state, the logic diagram of FIG. 3 is used, leading to the detection and identification of the errors set forth above according to the correlation of Table 5 and the explanations above, summarized (and translated into codes) in Table 6 (noting that in this table, 2xx is taken instead as 200 like in Table 5, just for adding an additional safety margin). As can be seen in this Table, correct functioning is diagnosed when all phases are inactive when not activated, and when they are all active when one is active. In all other cases, there is a malfunctioning the nature of which (short circuit to power or ground, or open circuit) can be detected based on the association between status code and measurement code. This method can be generalized to any motor with a star connection of 3 phases.

According to a second embodiment, the method of the invention may be applied to 2 actuators of 2 separate devices which share a common LS switch (which is interesting from an economical point of view but which renders diagnosis more difficult). In this embodiment, each HS and LS comprises an additional switch (also called diagnosis switch) which is in parallel with the actuating switch.

These devices may be 2 different functional parts of an SCR system, like for instance to 2 different heaters, to a heater and a pump . . .

Figure 10:
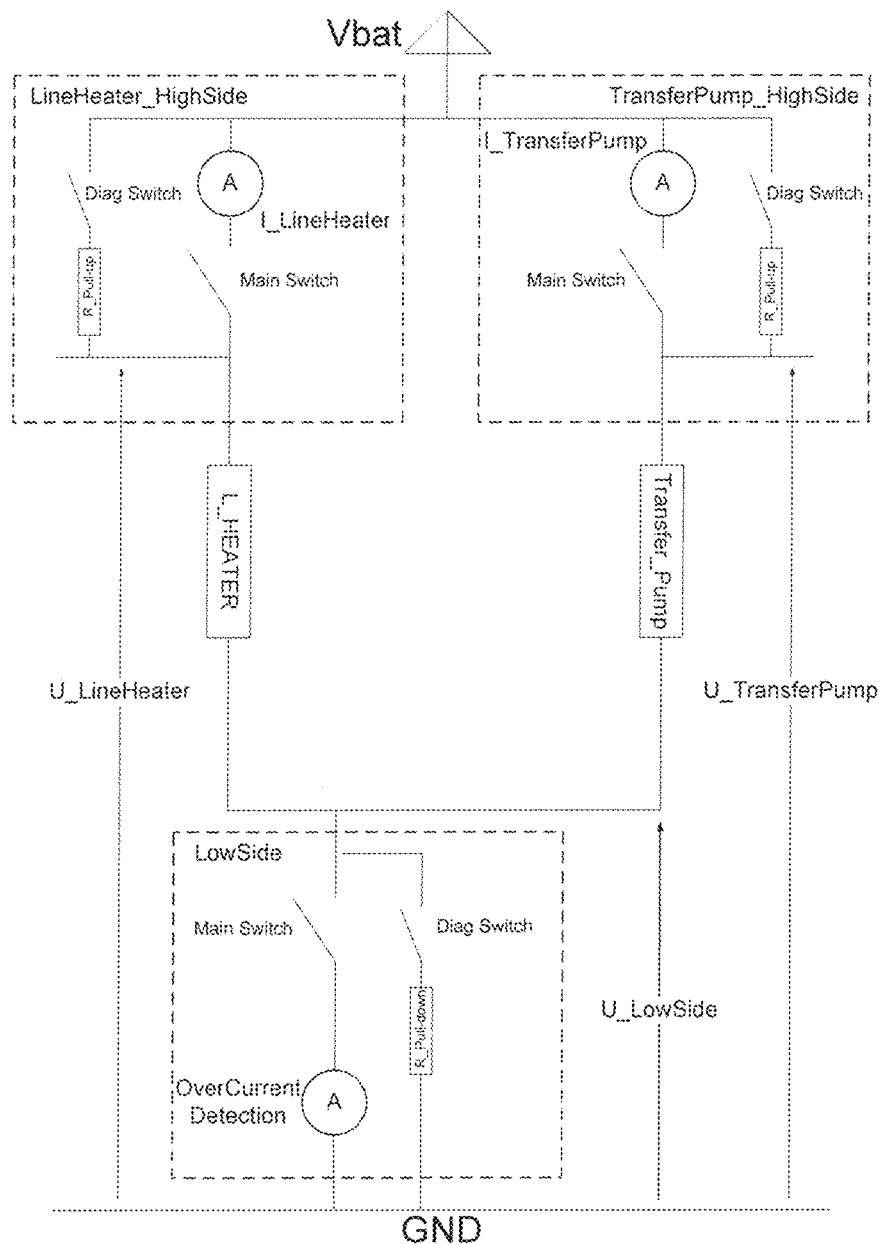
FIG. 10 shows a second electrical circuit to which a method according to a second embodiment of the invention can be applied.
Figure 18:
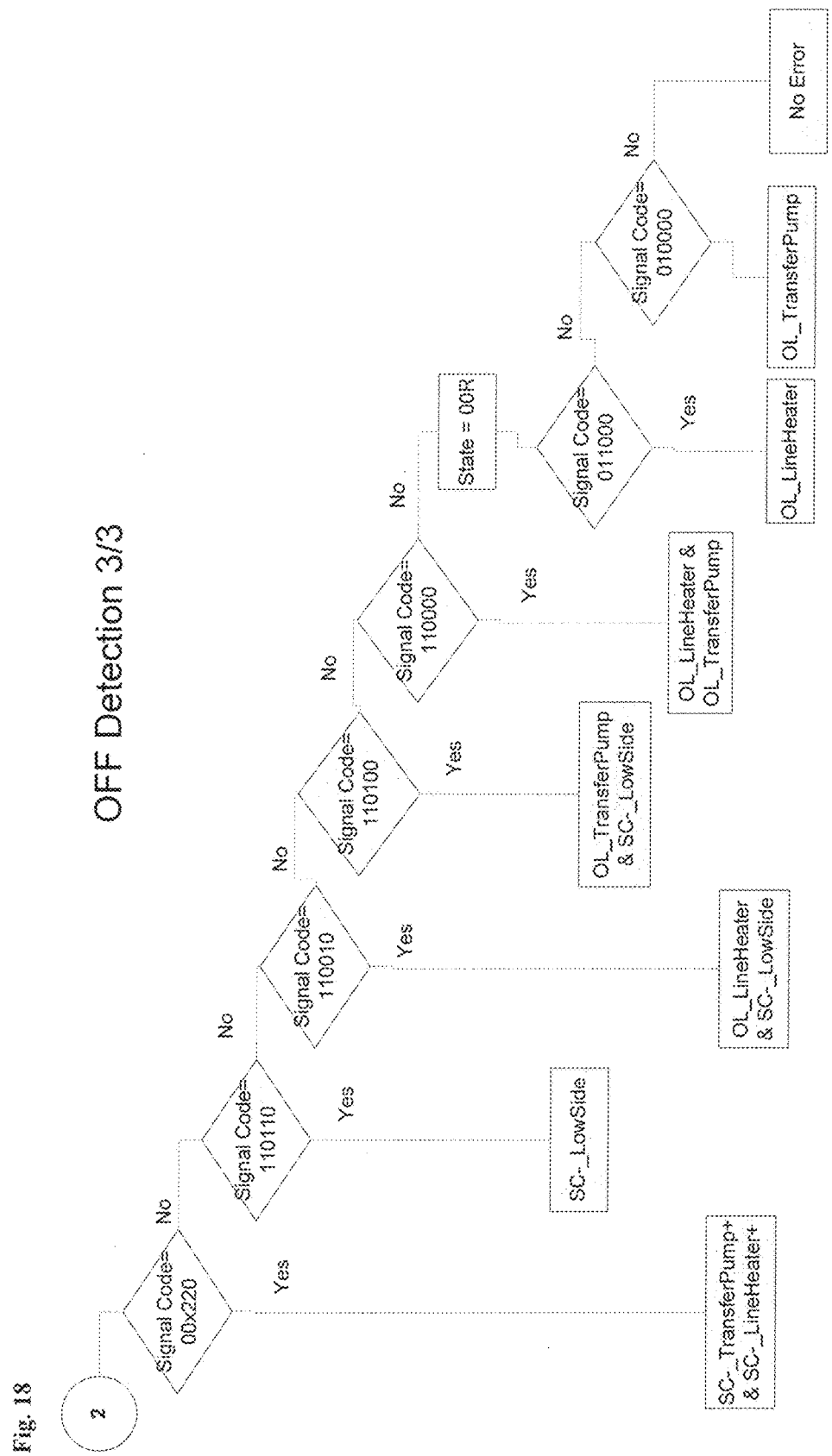
Figure 19:
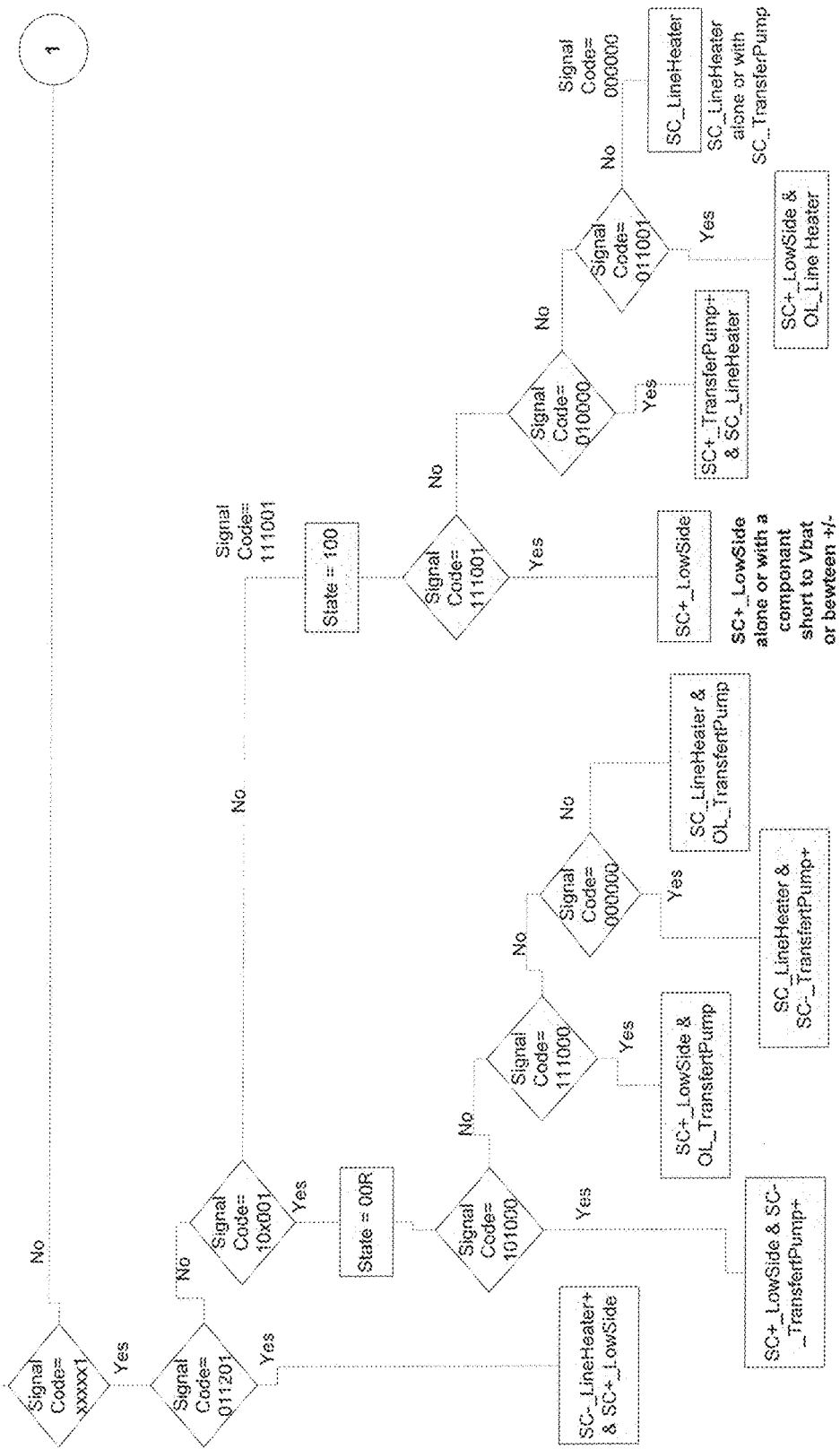
Figure 20:
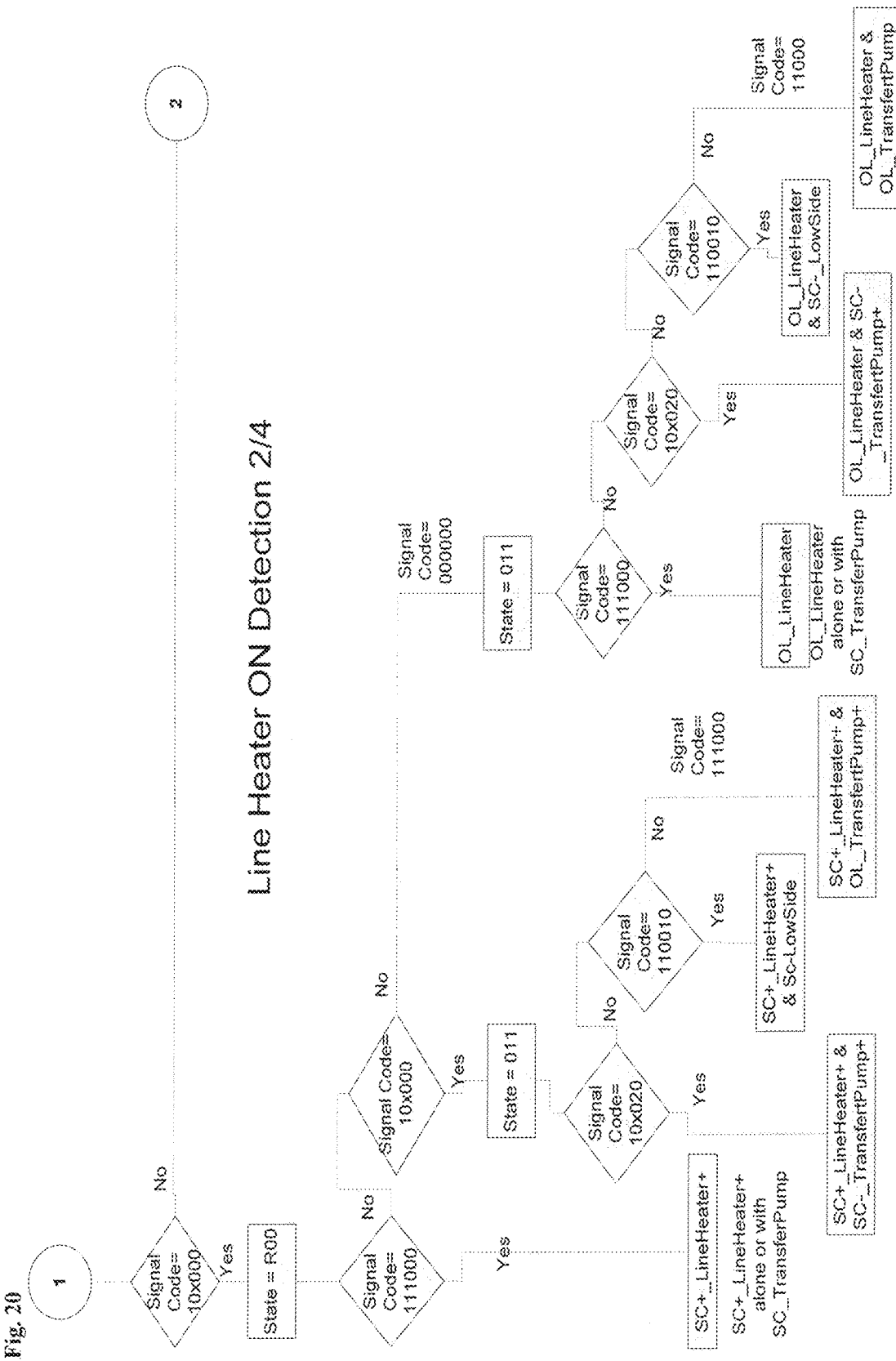
Figure 21:
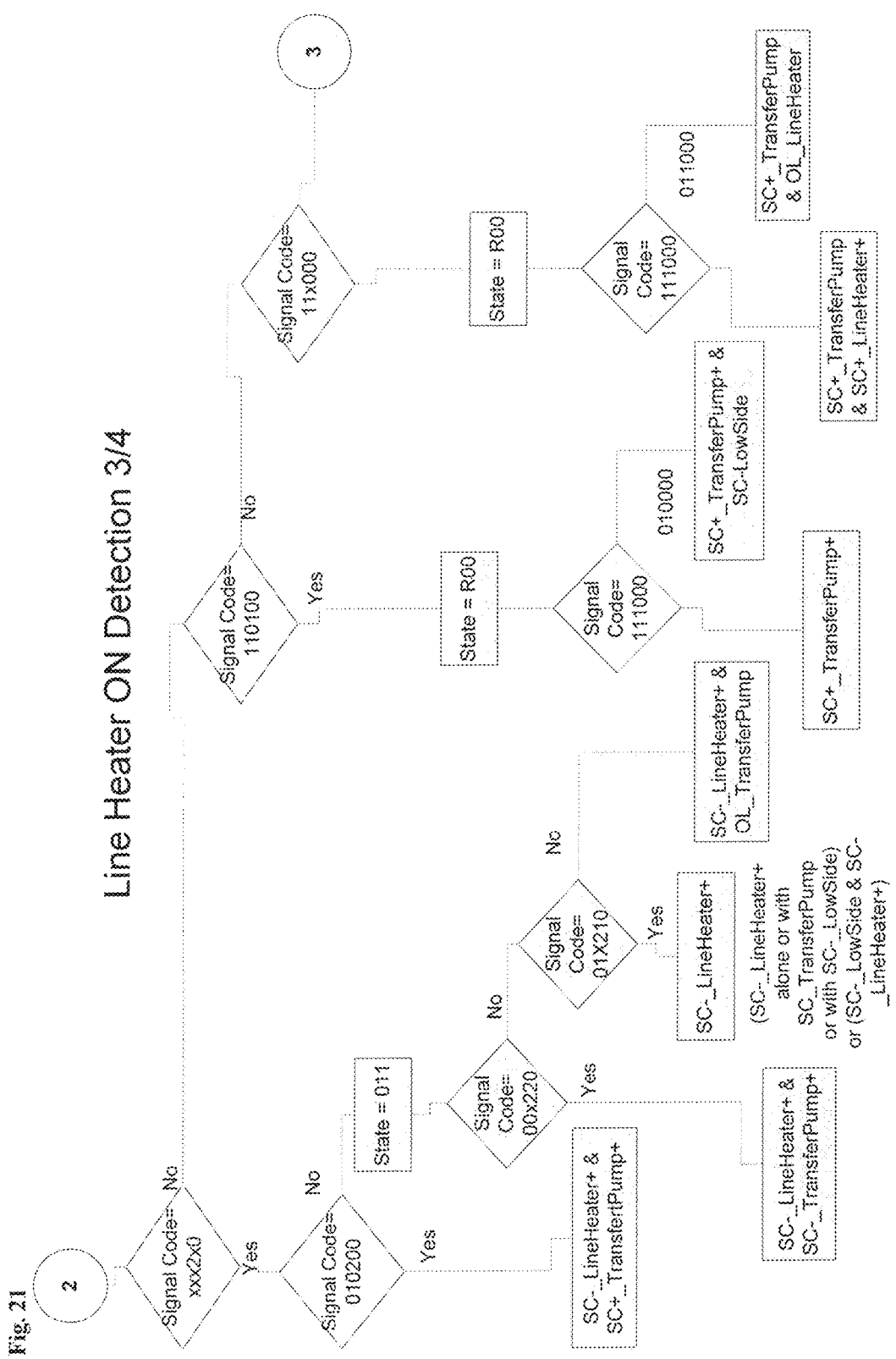
Figure 22:
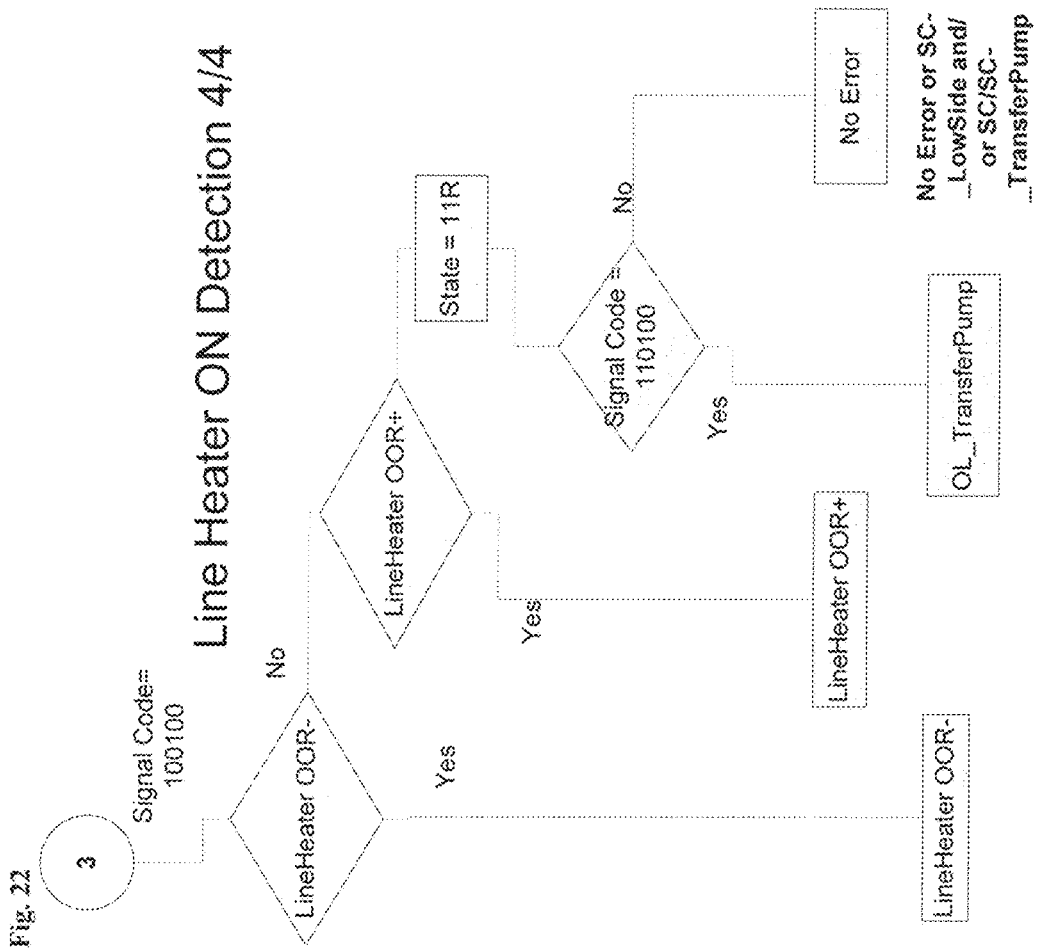
Figure 23:
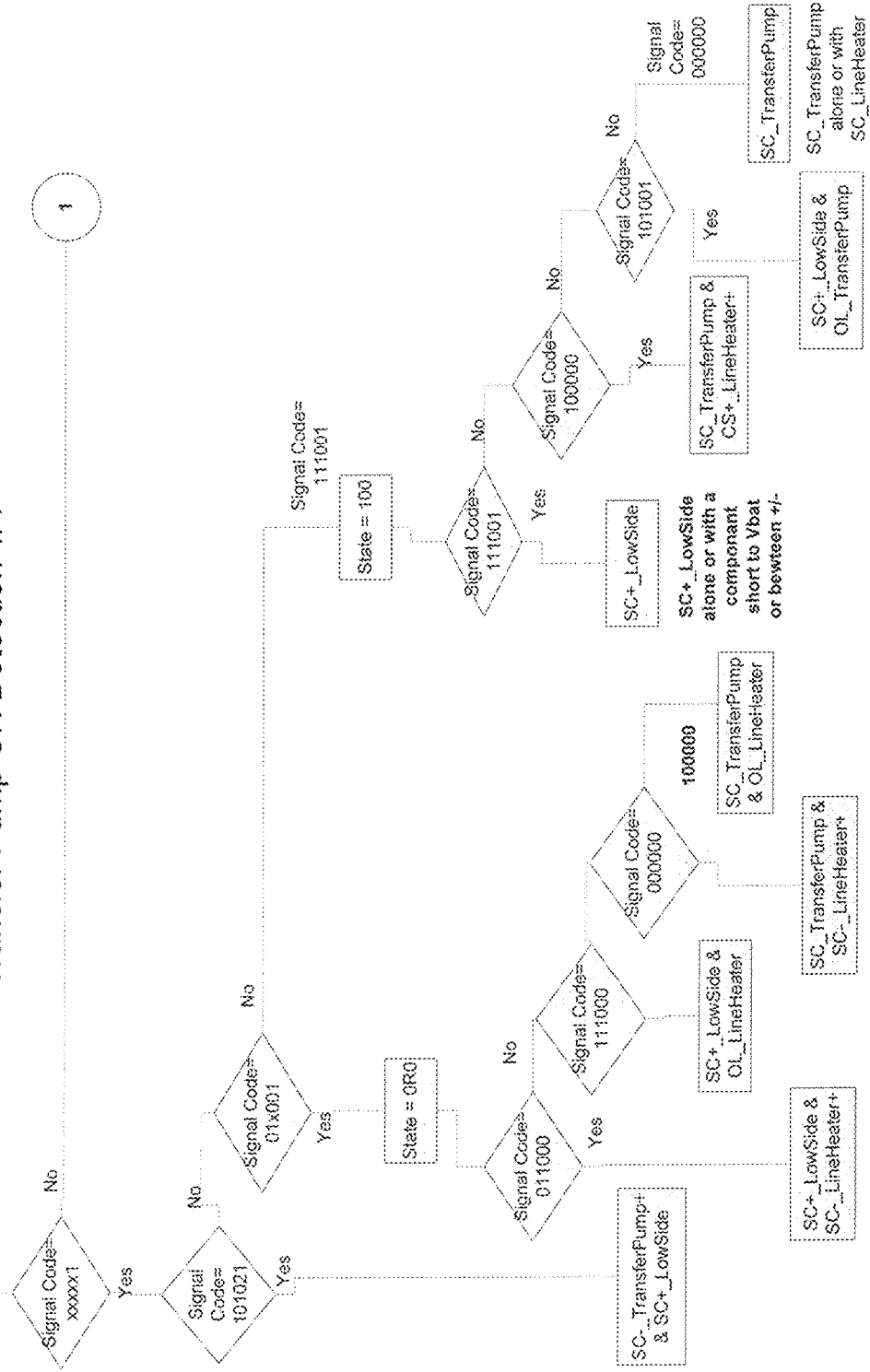
Figure 24:
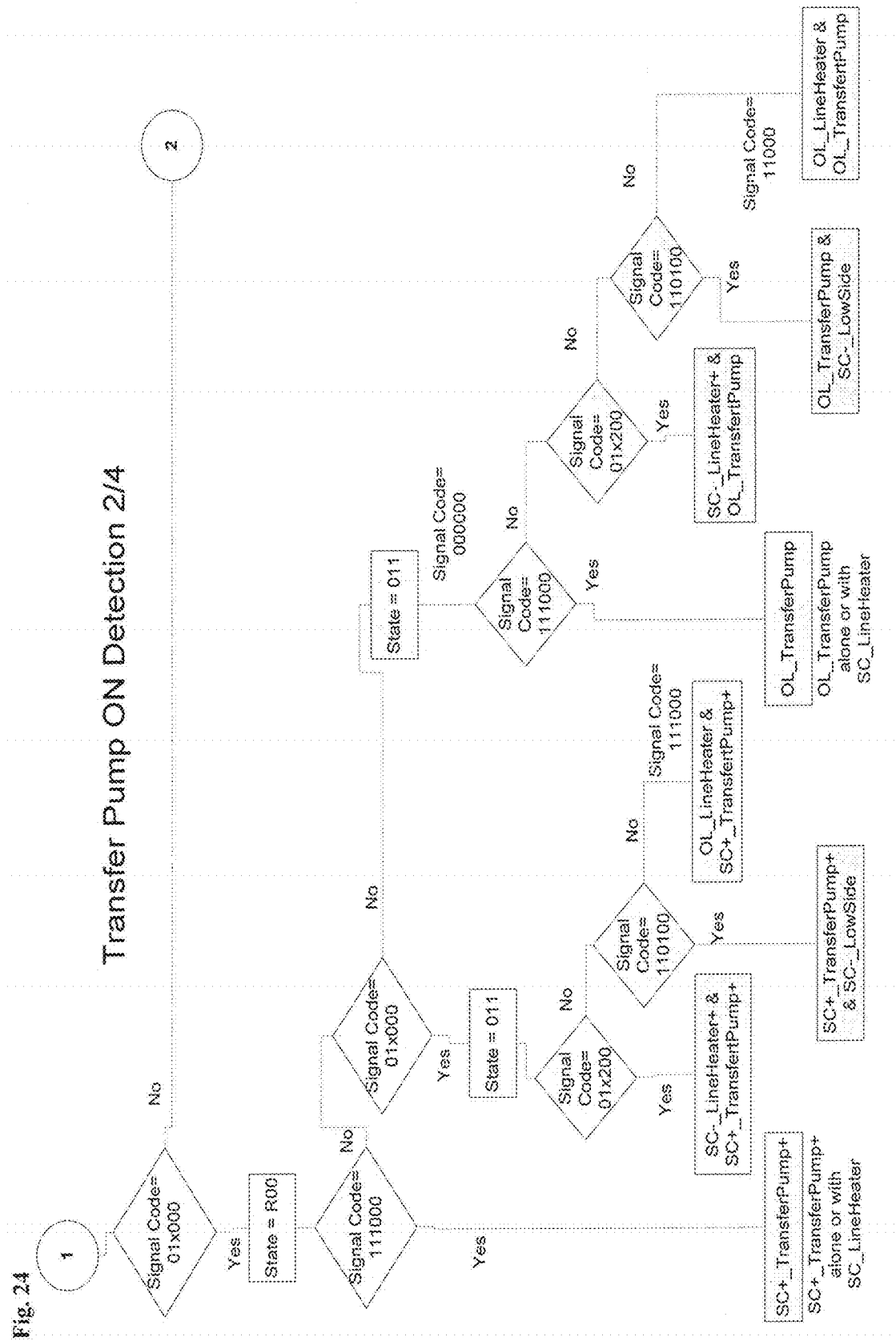
Figure 25:
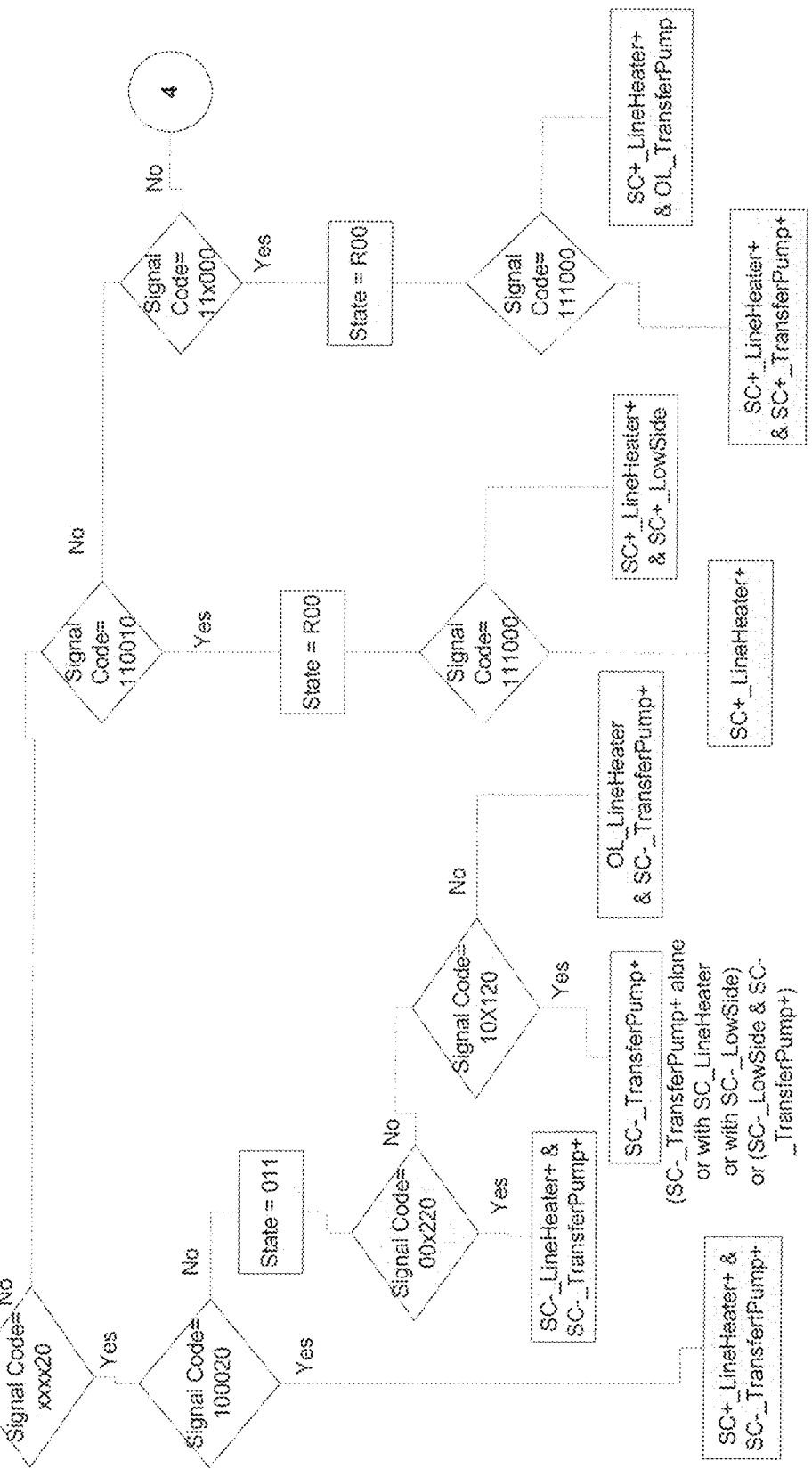
Figure 26:
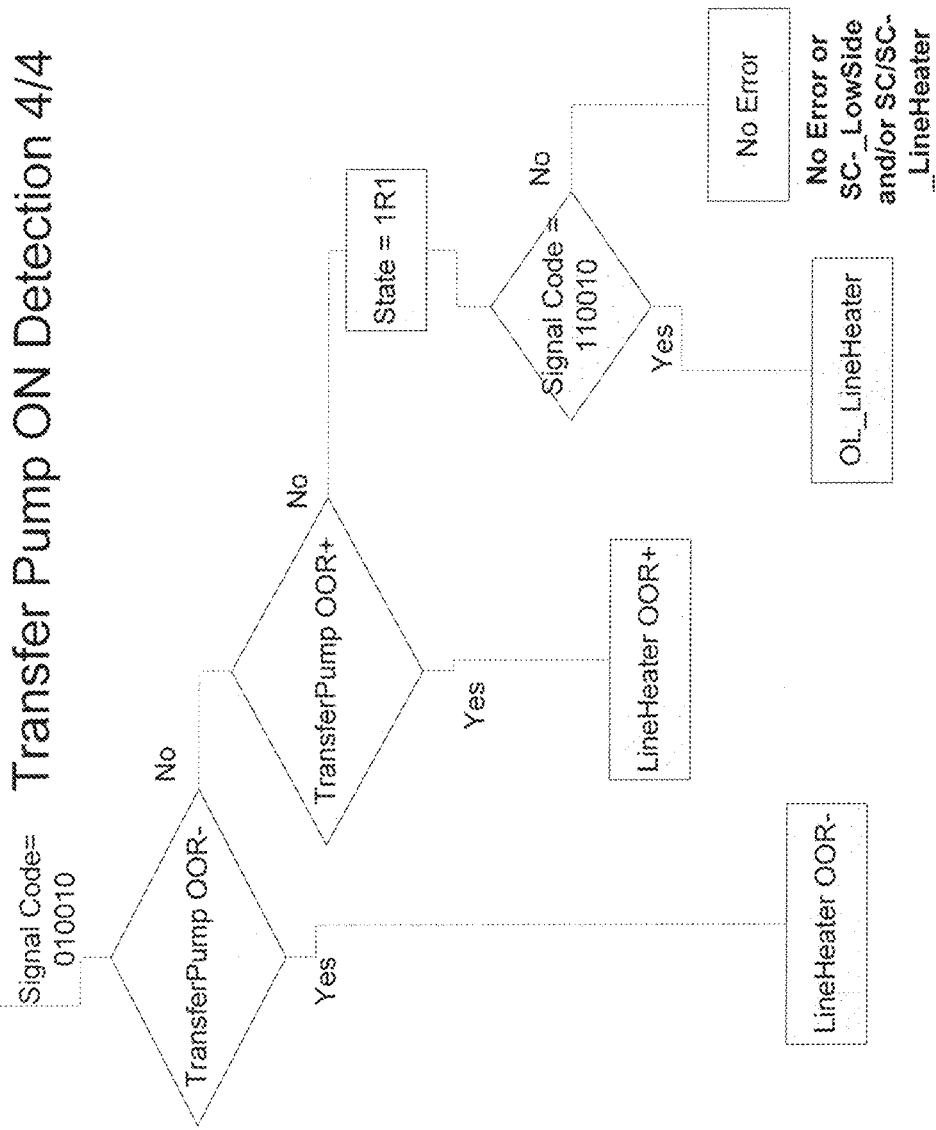
Figure 27:
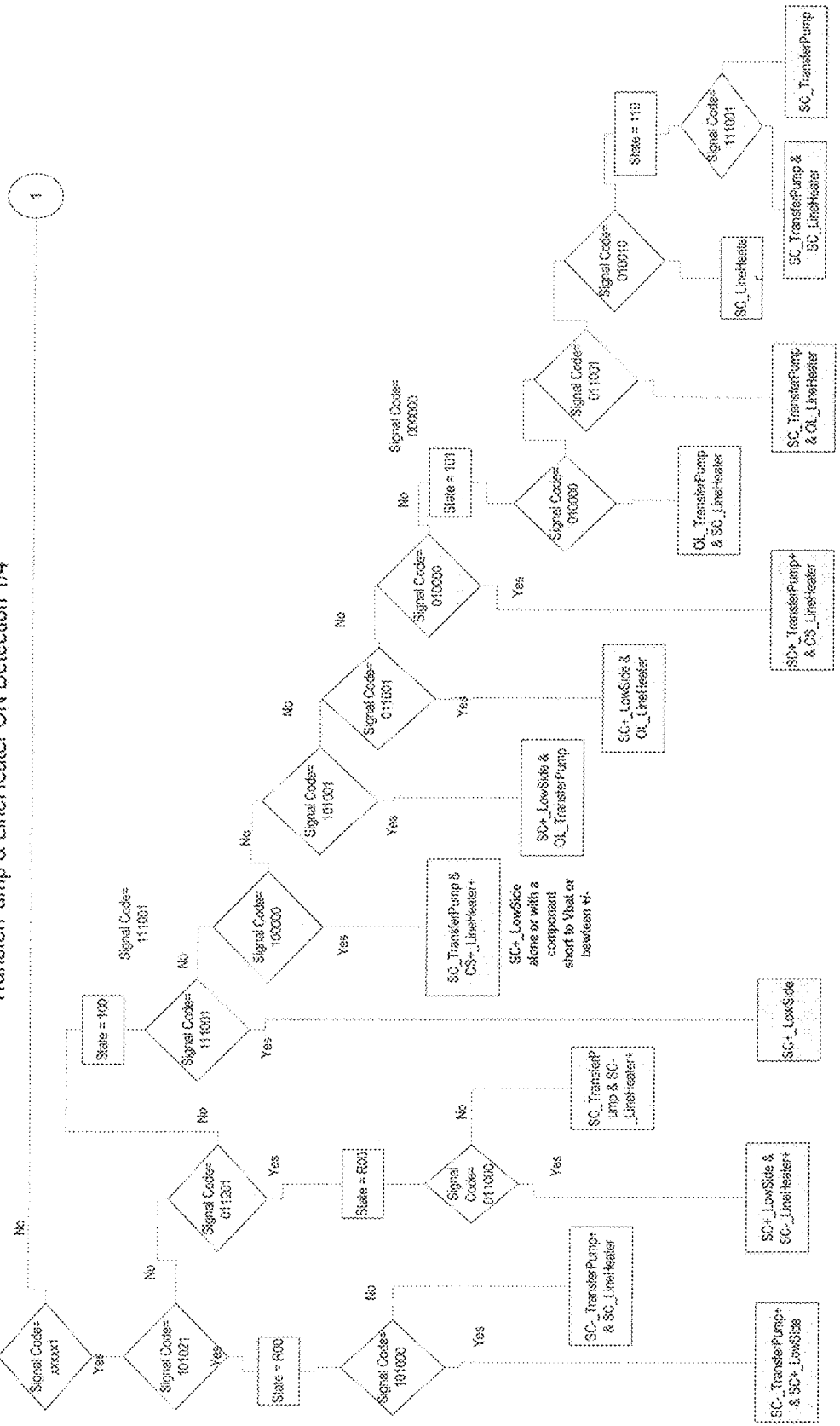
Figure 28:
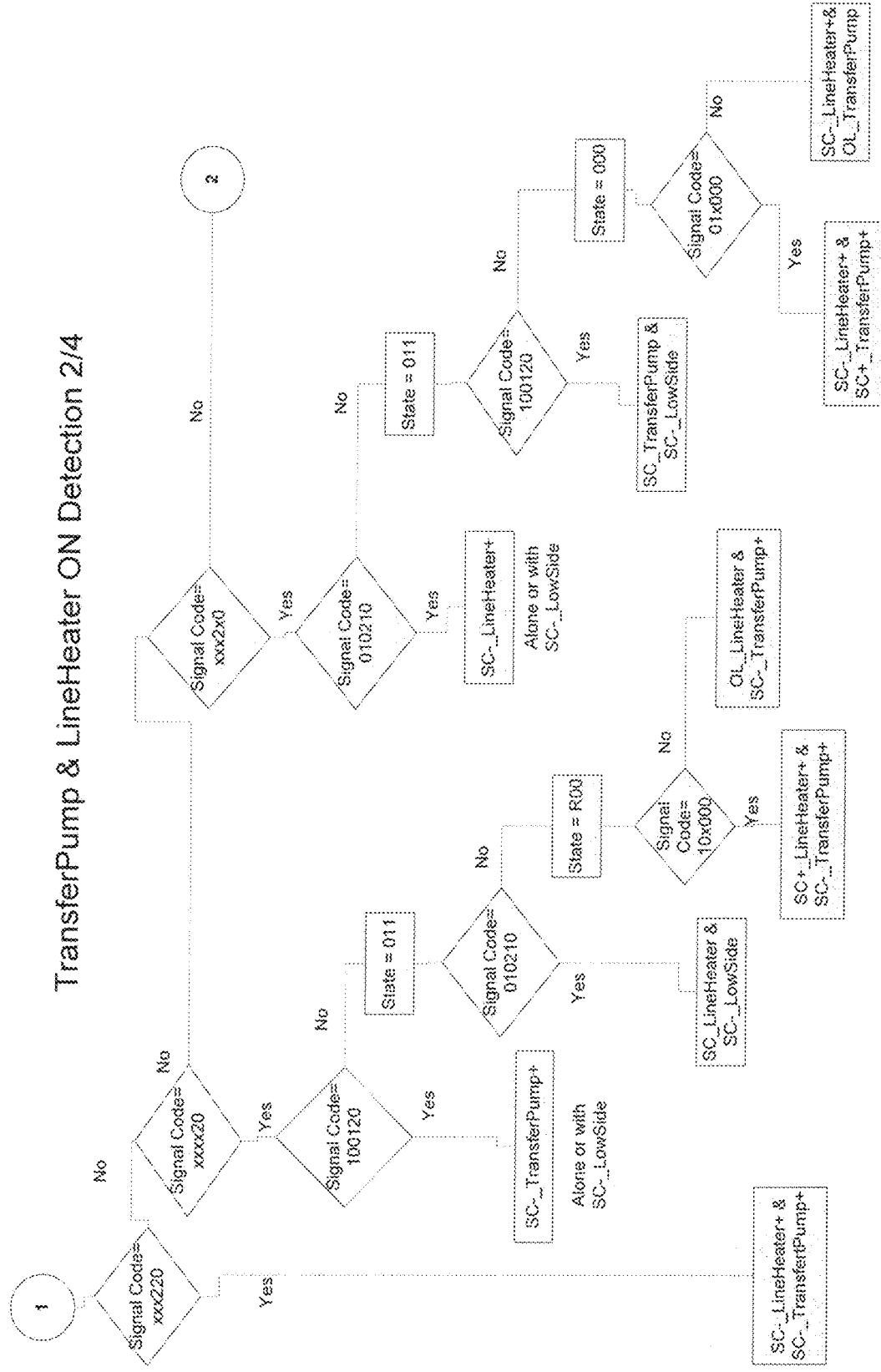
Figure 29:
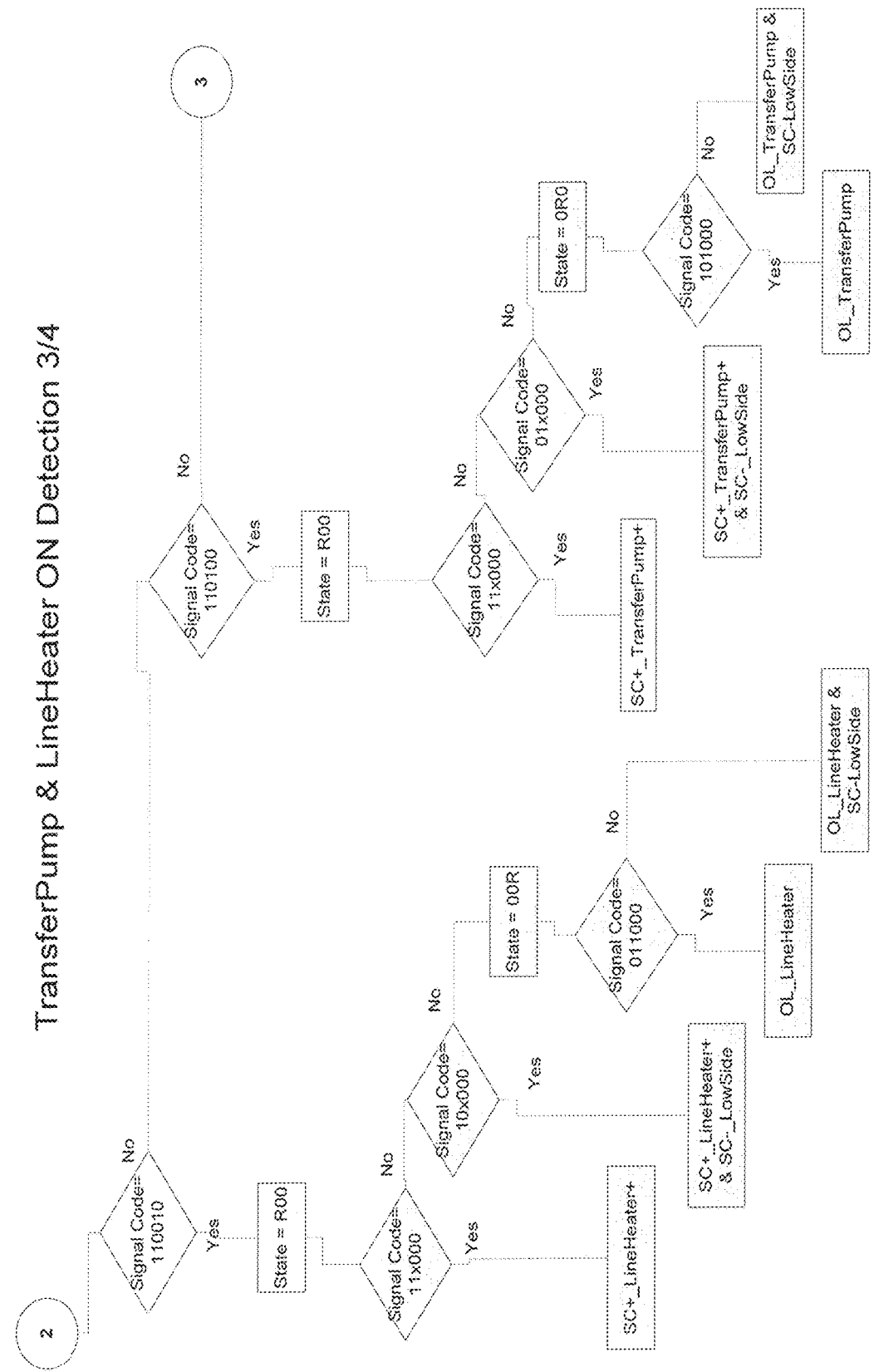
Figure 30:
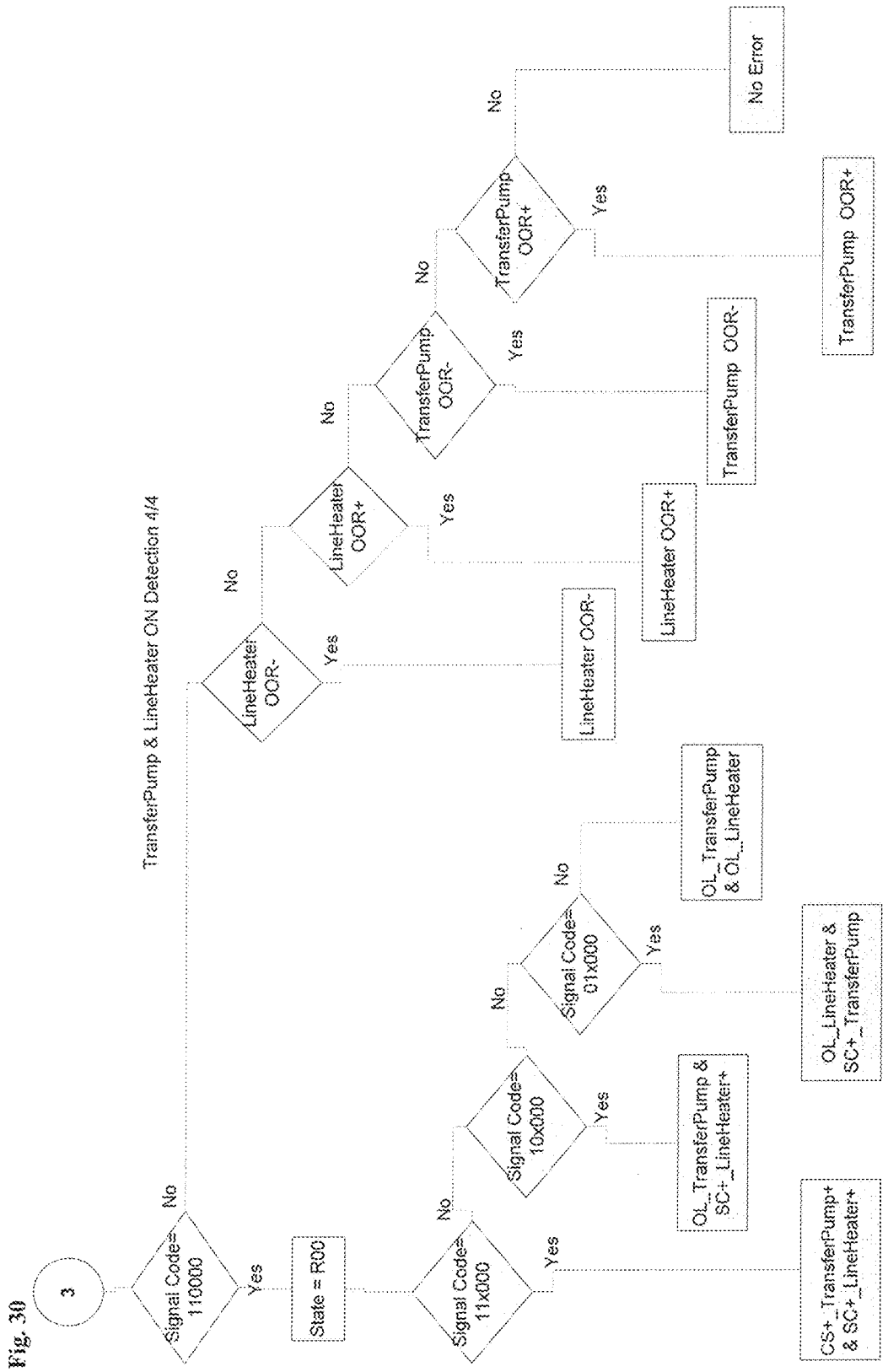

The method according to this embodiment of the invention will be described more in detail below for the specific case (example) of an electrical circuit comprising a line heater (for instance: the heater used to heat up the urea feed line) and a transfer pump (pump used to transfer pump from a passive, storage reservoir to an active, heated one), and which is depicted in FIG. 10 attached. Again, this example is purely illustrative and none of the specific features thereof (codes used, specific algorithms . . . ) should be seen as limiting the scope of the invention.

As for the first embodiment, the method requires, in order to be implemented, the following preliminary steps:
 defining a measurement code but this time, according to Tables 7 and 8 attached, the measurement code is a 6 digit code (instead of a 3 digit code);
 defining a status code according to Tables 9.1 to 9.4, which this time is a 3 digit code, each digit having 3 possible values (0, 1 or R)
 listing the different possible errors to be detected, as in Table 10 attached
 establishing so called "True tables" giving the measurement codes associated with different status codes and the possible errors associated therewith for each possible diagnosis condition (while both line heater and transfer pump are inactivated (=OFF DETECTION); when only one of them is activated (=line heater ON DETECTION or transfer pump ON DETECTION) or when both are activated (transfer pump & line heater ON DETECTION)).

To implement the method according to this embodiment of the invention, the circuit is successively put in different statuses, the sequence of which depends on the condition in which the system is (OFF, line heater or transfer pump ON, both ON). These sequences are listed in the logic diagrams of FIGS. 16 to 30 attached, which also illustrate how different errors can be detected and differentiated one from another.

A third embodiment of the present invention may be applied to the actuator of a single device having an actuating switch. In this embodiment also, both the HS and the LS of the actuator comprises an additional switch (also called diagnosis switch) which is in parallel with the actuating switch.

Figure 31:
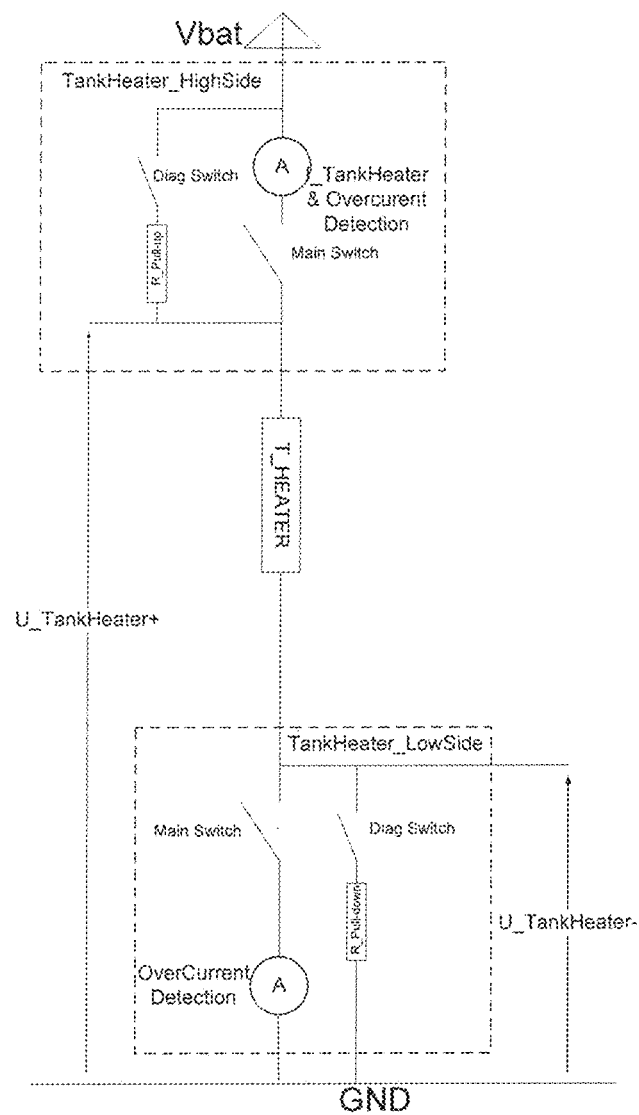
FIG. 31 shows a third electrical circuit to which a method according to a third embodiment of the invention can be applied.
Figure 36:
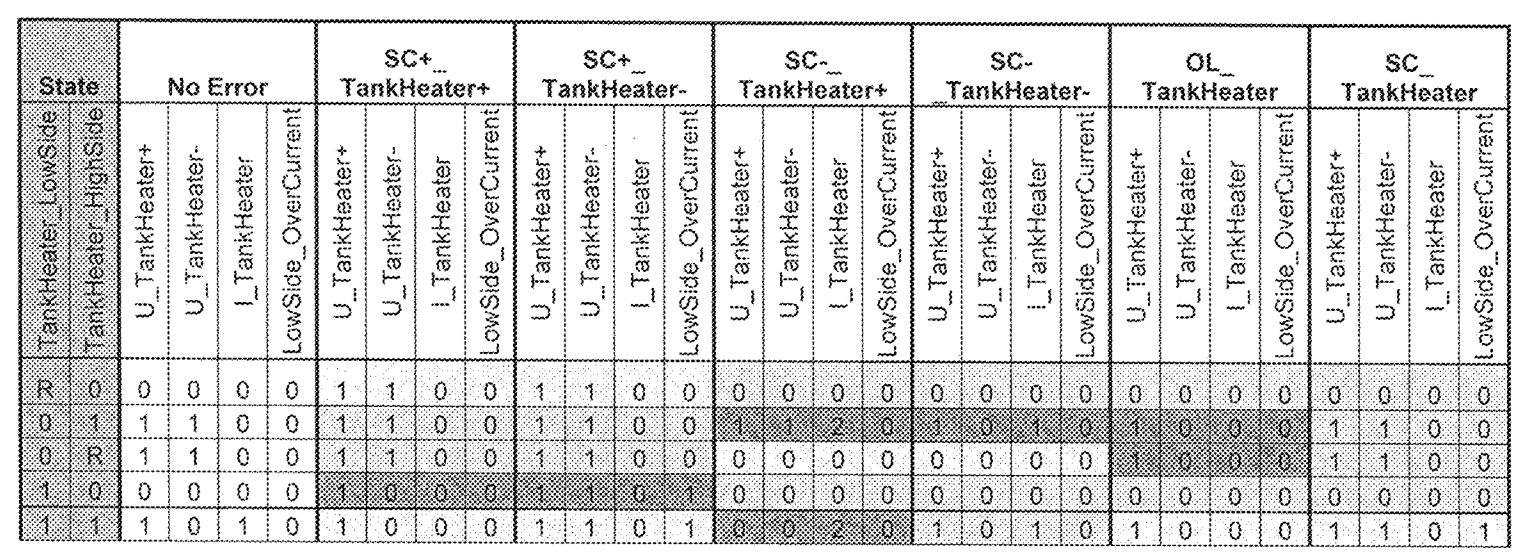
Figure 37:
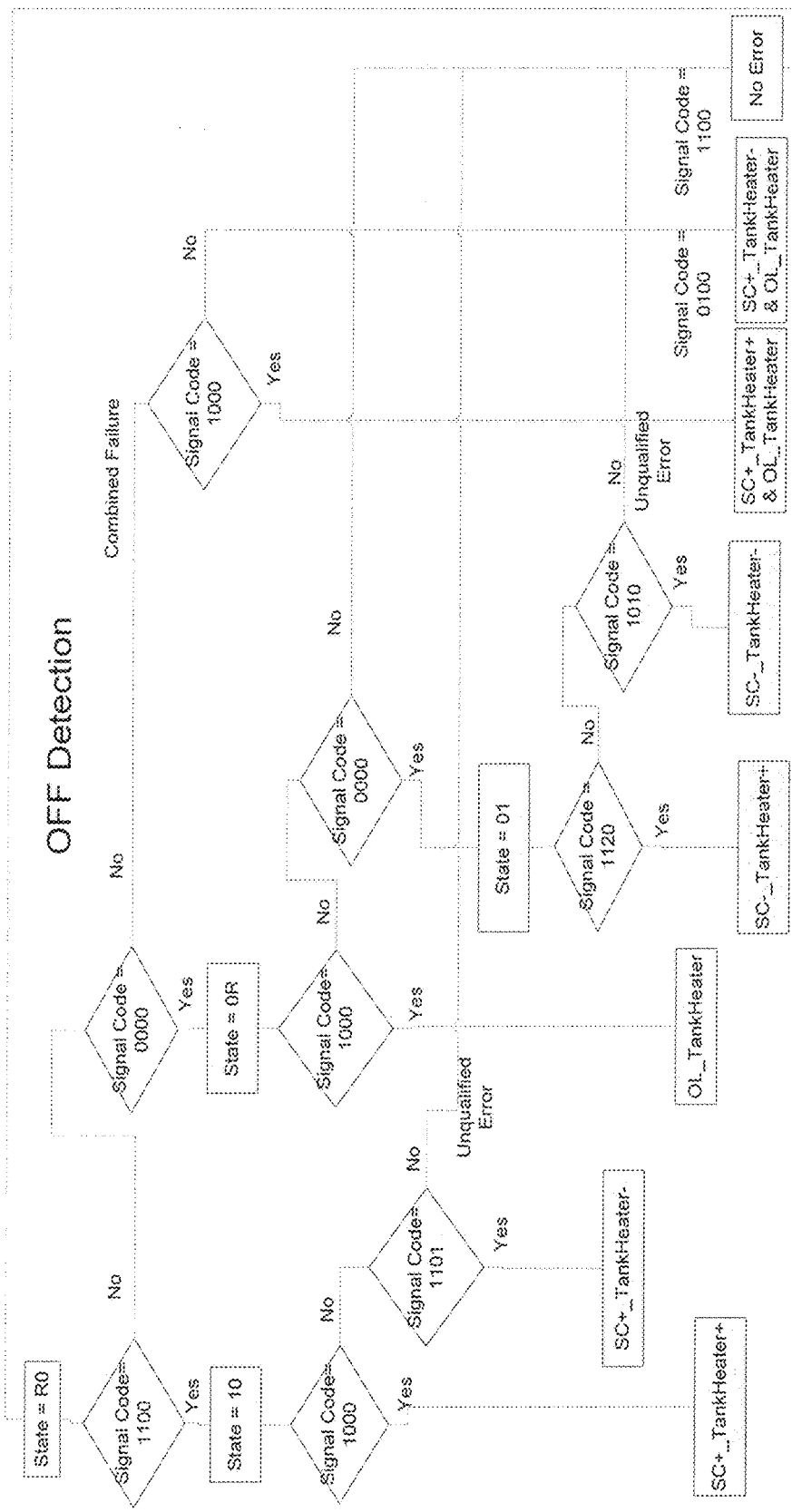
FIGS. 37 and 38 show the logic diagram leading to the detection and identification of the errors.
Figure 38:
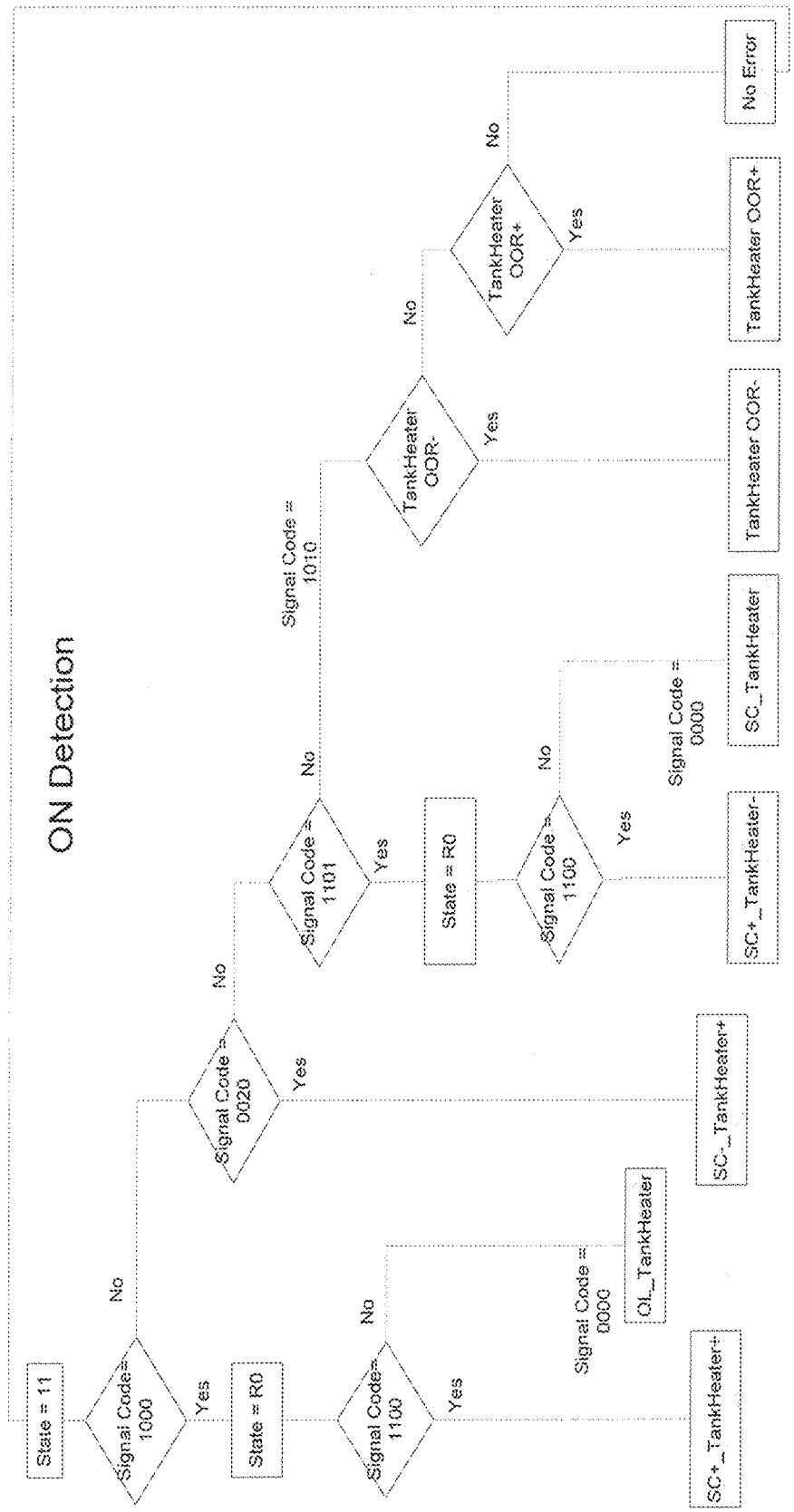

This embodiment is illustrated in the case of an SCR tank heater by FIGS. 31 to 38 and Tables 12 to 16 attached:
 FIG. 31 showing the concerned electrical circuit
 tables 12 and 13, the measurement steps and code generation
 Tables 14.1 to 14.3, the status code association
 Table 15, the types of errors that can be detected
 Table 16, the association between measurement codes and status codes and the possible errors associated therewith
 FIGS. 37 and 38, the logic diagram leading to the detection and identification of errors.

The invention claimed is:

1. A method for diagnosing an electrical circuit including at least one electrical device, an actuator for the device controlled by a high side (HS) actuating switch and a low side (LS) actuating switch, and at least one additional switch not being in series with any of the HS or LS actuating switches, the method comprising:
 giving a status code to each of a plurality of possible statuses of the circuit;
 sequentially putting the circuit in at least some of the plurality of possible statuses for a given time period;
 during each given time period, measuring voltage and/or current in different parts of the circuit and giving a measurement code to the measurement;

establishing a diagnosis of correct functioning or of a malfunctioning of at least some elements of the circuit according to a pre-established correlation between the status codes and the measurement codes, wherein the electrical circuit comprises two actuators for two separate devices which share a common LS actuating switch, each HS actuating switch and LS actuating switch comprising an additional switch or diagnosis switch in parallel with the actuating switch.

2. A method according to claim 1, wherein the electrical device comprises a motor comprising at least 3 electrical phases A, B, C connected in star, and the method further comprising:
sequentially activating each phase using HS and LS actuating switches corresponding to the respective phase, then grounding each phase, while the other phases remain inactivated;
to each activation and grounding, giving a phase status code;
during each activation and grounding, measuring voltage in each of the phases and giving a phase measurement code to the measurement;
establishing a diagnosis of correct functioning or of malfunctioning of each of the phases of the motor according to a correlation table between the phase status codes and the phase measurement codes.

3. A method according to claim 2, wherein the motor is a BLDC (brushless direct current) motor and each phase comprises at least one magnetic coil.

4. A method according to claim 2, further comprising:
detecting short circuits to a power supply when none of the motor phases are activated and a certain voltage is measured on any of the phases;
detecting short circuits to ground when one phase is activated and an over current is measured OR the commanded phase voltage remains at a very low level;
detecting open circuits when one phase is activated and no voltage is measured on the other phases.

5. A method according to claim 2, wherein the motor is associated with a circuitry providing at least one of:
one high side driver for each phase, which allows to perform the activation;
one low side driver for each phase, which allows to perform the grounding;
one current measurement and over current detection/protection.

6. Method according to claim 5, further comprising a sequence of:
Step 0—providing no command to any phase;
Step 1—activating the high side driver for phase A;
Step 2—deactivating the high side drivers for phases A, B, C, or grounding phase A using the low-side driver of phase A;
Step 3—activating the high side driver for phase B;
Step 4—deactivating the high side drivers for phases A, B, C, or grounding phase B using the low-side driver of phase A;
Step 5—activating the high side driver for phase C; and
Step 6—deactivating the high side drivers for phases A, B, C or grounding phase C.

7. A method according to the claim 6, wherein in each step of the sequence, the voltage is measured in the 3 phases, and wherein to each of the 3 measurements, a one digit code is given so that for each of the steps, a measurement code with 3 digits is generated.

8. A method according to claim 6, wherein to each step of the sequence, a 6 digit status code is associated as follows:
all 6 digits are equal to 0 in step 0, only one digit is equal to 1 in steps 1-6, while the others are equal to 0, the only digit being equal to 1 being different for each step.

9. A method according to claim 2, wherein the motor drives a rotating pump used to convey urea from a storage tank to an exhaust pipe of an engine.

10. A method according to claim 1, further comprising:
defining a 6 digit measurement code;
defining a 3 digit status code, each digit having 3 possible values;
listing different possible errors to be detected; and
establishing tables giving the measurement codes associated with different status codes and the possible errors associated therewith for each possible diagnosis condition.

11. A method according to claim 10, wherein:
the 2 devices are a line heater and a transfer pump of an SCR system;
possible diagnosis conditions are OFF DETECTION, line heater ON DETECTION, transfer pump ON DETECTION and transfer pump and line heater ON DETECTION;
the circuit is successively put in different statuses, the sequence of which depends on the diagnosis condition in which the system is OFF, the line heater is ON, the transfer pump is ON, or both the line heater and transfer pump are ON; and
a diagnosis of correct functioning or of malfunctioning of the circuit devices is established according to correlation tables and/or diagrams between the status codes and the measurement codes.

12. A method according to claim 1, wherein the device is a heater for a tank of an SCR system.

* * * * *